(12) United States Patent
Song et al.

(10) Patent No.: US 10,636,547 B2
(45) Date of Patent: Apr. 28, 2020

(54) ELECTRONIC DEVICE AND NOISE CONTROL METHOD THEREOF

(71) Applicant: Samsung Electronics Co., Ltd., Suwon-si, Gyeonggi-do (KR)

(72) Inventors: Minwoo Song, Gumi-si (KR); Jungho Kim, Gumi-si (KR); Euichan Jung, Gumi-si (KR); Jiwoo Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 142 days.

(21) Appl. No.: 15/691,169

(22) Filed: Aug. 30, 2017

(65) Prior Publication Data
US 2018/0096754 A1 Apr. 5, 2018

(30) Foreign Application Priority Data

Sep. 30, 2016 (KR) ........................ 10-2016-0126575

(51) Int. Cl.
| | |
|---|---|
| H04N 5/225 | (2006.01) |
| H01B 11/00 | (2006.01) |
| H05K 1/02 | (2006.01) |
| G01P 13/00 | (2006.01) |
| G01P 15/08 | (2006.01) |
| G03B 5/04 | (2006.01) |
| G03B 13/36 | (2006.01) |
| H02J 7/00 | (2006.01) |

(Continued)

(52) U.S. Cl.
CPC ............ *H01B 11/002* (2013.01); *G01P 13/00* (2013.01); *G01P 15/0802* (2013.01); *G03B 5/04* (2013.01);
(Continued)

(58) Field of Classification Search
CPC ..... G01P 13/00; G01P 15/0802; G03B 13/36; G03B 5/04; G03B 2205/0069; H01B 11/002; H02J 7/0068; H02J 7/025; H04N 5/225; H04N 1/0228; H04N 5/23287; H05K 1/0228; H05K 1/189; H05K 2201/093; H05K 2201/09672; H02K 1/22
See application file for complete search history.

(56) References Cited

U.S. PATENT DOCUMENTS

| | | | |
|---|---|---|---|
| 7,633,526 B2 | 12/2009 | Lee et al. | |
| 8,400,516 B2 | 3/2013 | Yamada et al. | |

(Continued)

FOREIGN PATENT DOCUMENTS

| | | | |
|---|---|---|---|
| KR | 10-2011-0057066 A | 5/2011 | |
| KR | 10-2012-0038184 A | 4/2012 | |

(Continued)

OTHER PUBLICATIONS

European Search Report dated Jan. 17, 2018, issued in European Patent Application No. 17193287.4-1208.

*Primary Examiner* — William R Alexander
*Assistant Examiner* — Balram T Parbadia
(74) *Attorney, Agent, or Firm* — Jefferson IP Law, LLP

(57) ABSTRACT

An electronic device and a noise control method thereof are provided. The electronic device includes a cable having a first layer forming a first power line and a second layer forming a second power line. The first and second layers are arranged in a vertical stack structure. The cable cancels a magnetic field generated by a current in charging and discharging a battery cell of the electronic device, and removes a noise due to a magnetic field generated from a coil-contained component of the electronic device. Other various embodiments are possible.

19 Claims, 19 Drawing Sheets

(51) Int. Cl.
*H02J 7/02* (2016.01)
*H02K 1/22* (2006.01)
*H04N 5/232* (2006.01)

(52) U.S. Cl.
CPC ............ *G03B 13/36* (2013.01); *H02J 7/0068* (2013.01); *H04N 5/225* (2013.01); *H05K 1/0216* (2013.01); *H05K 1/0228* (2013.01); *G03B 2205/0069* (2013.01); *H02J 7/025* (2013.01); *H02K 1/22* (2013.01); *H04N 5/23287* (2013.01)

(56) References Cited

U.S. PATENT DOCUMENTS

| | | | |
|---|---|---|---|
| 2011/0111267 A1* | 5/2011 | Van Schyndel | H01M 2/26 429/10 |
| 2012/0209433 A1* | 8/2012 | Paz Rodriguez | B25J 5/007 700/259 |
| 2012/0315025 A1* | 12/2012 | Wakamatsu | H04N 5/23248 396/55 |
| 2013/0104410 A1 | 5/2013 | Wade et al. | |
| 2014/0057681 A1* | 2/2014 | Grivas | G06F 3/044 455/566 |
| 2014/0160696 A1 | 6/2014 | Lee et al. | |
| 2015/0085261 A1* | 3/2015 | Lee | G01R 33/283 353/79 |
| 2016/0064130 A1 | 3/2016 | Eng et al. | |

FOREIGN PATENT DOCUMENTS

| | | |
|---|---|---|
| KR | 10-1317768 B1 | 10/2013 |
| KR | 10-1595935 B1 | 2/2016 |

\* cited by examiner

FIG. 6
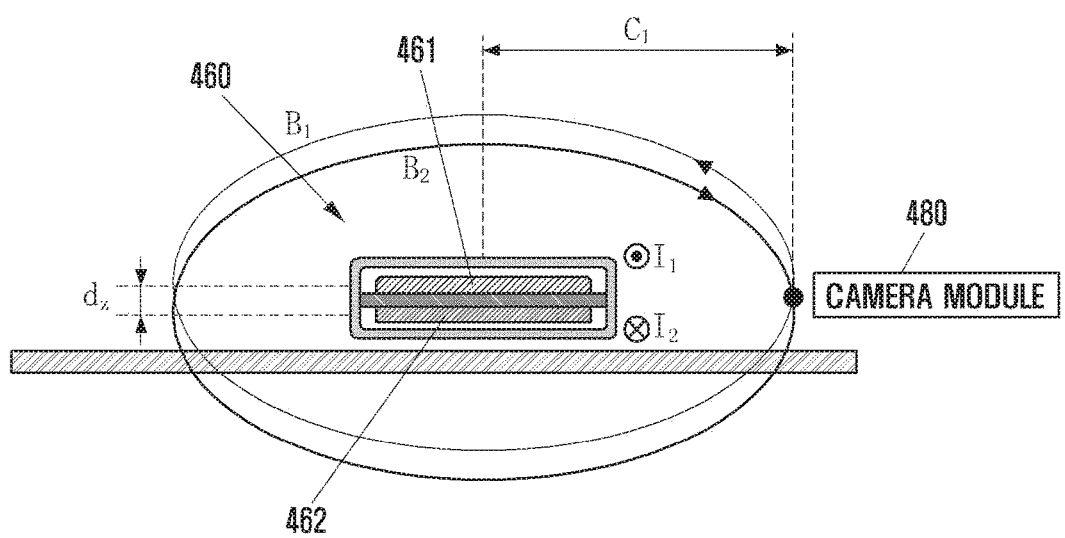
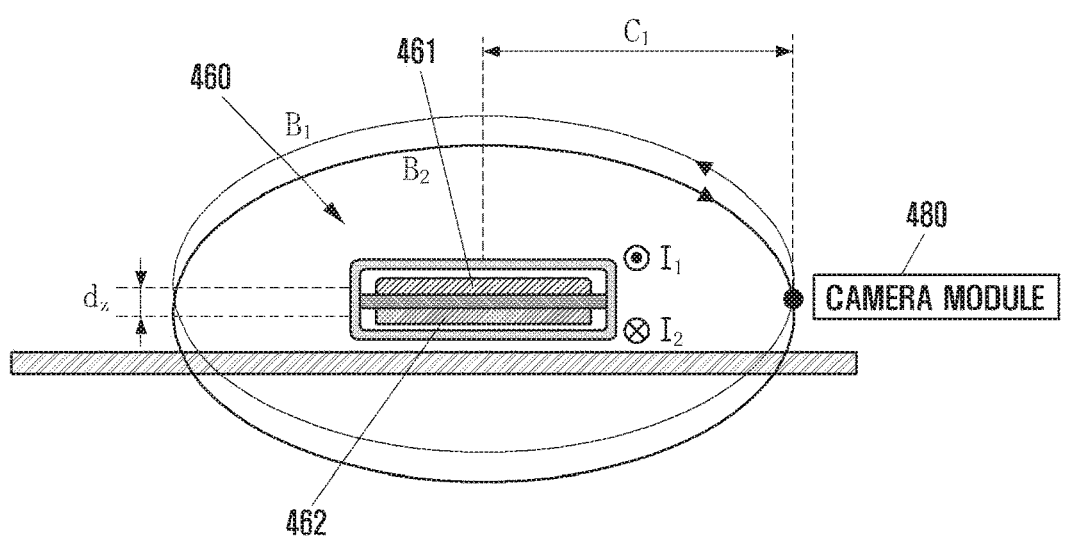

FIG. 12
| ORIENTATION | DIRECTION OF MAGNETIC FIELD | OPERATING VOLTAGE OF CAMERA MODULE DRIVER (OIS) | OPERATING VOLTAGE OF CAMERA MODULE DRIVER (AF) | EXAMPLE |
|---|---|---|---|---|
| UP (NO USE TDMA) | ORTHOGONAL | 0V (NO USE CAMERA) | 0V (NO USE CAMERA) | 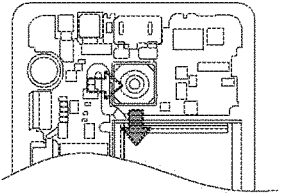 |
| UP | ORTHOGONAL | 2.6V(Mid) | 2.6V(Mid) | 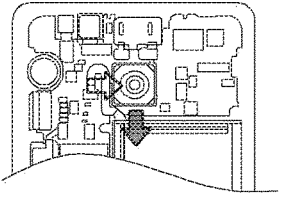 |
| DOWN | ORTHOGONAL | 2.6V(Mid) | 2.6V(Mid) | 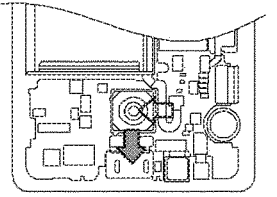 |
| LEFT | OPPOSITE | 3.3V(High) | 3.3V(High) | 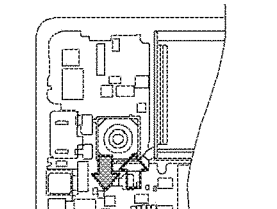 |
| RIGHT | SAME | 1.8V(Low) | 1.8V(Low) | 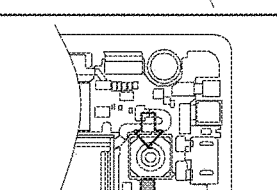 |
 : DIRECTION OF GRAVITY
 : DIRECTION OF MAGNETIC FIELD

ELECTRONIC DEVICE AND NOISE CONTROL METHOD THEREOF

CROSS-REFERENCE TO RELATED APPLICATION(S)

This application claims the benefit under 35 U.S.C. § 119(a) of a Korean patent application filed on Sep. 30, 2016 in the Korean Intellectual Property Office and assigned Serial number 10-2016-0126575, the entire disclosure of which is hereby incorporated by reference.

TECHNICAL FIELD

The present disclosure relates to an electronic device and a method for controlling a noise of the electronic device to be minimized.

BACKGROUND

An electronic device such as a smart phone may have an embedded battery, for example.

The embedded battery may include a battery cell for storing a current, a flexible printed circuit board (FPCB) for connecting the battery cell and a PCB equipped in the electronic device, and a protection circuit module (PCM) for controlling charging and discharging of the battery cell.

Typically, the FPCB may be configured to include a first power line (i.e., a positive terminal) and a second power line (i.e., a negative terminal) which are parallel to each other on the same plane.

The typical FPCB is often subjected to the generation of a high current caused by charging and discharging operations performed when an application of the electronic device is running.

For example, when the first power line (i.e., the positive terminal) and the second power line (i.e., the negative terminal) are spaced apart by a certain distance on the X-axis, a certain magnetic field may be generated.

The generated magnetic field affects a coil and a ball both of which are equipped in a camera module disposed adjacent to the FPCB, thus producing a noise such as vibration rattle.

In order to prevent such a noise from the camera module, the FPCB and the camera module may be designed to be separated from each other as much as possible. However, this results in the FPCB being adjacent to other components (e.g., a motor and a speaker) having a coil, and may cause an unexpected noise which is different from the noise created through the camera module.

Therefore, the structure of the typical FPCB having the first and second power lines parallel to each other on the same plane may not avoid the creation of various noises in the electronic device. Further, the typical FPCB structure may be under restrictions in a mounting structure.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device in which a flexible printed circuit board (FPCB) has a vertically stacked structure of first and second power lines, and also provide a control method for minimizing a noise created in the electronic device.

In accordance with an aspect of the present disclosure, an electronic device is provided. The electronic device includes a cable including a first layer forming a first power line and a second layer forming a second power line. The first and second layers are arranged in a vertical stack structure. The cable cancels a magnetic field generated by a current in charging and discharging a battery cell of the electronic device, and removes a noise due to a magnetic field generated from a coil-contained component of the electronic device.

In accordance with another aspect of the present disclosure, an electronic device is provided. The electronic device includes a communication circuit configured to perform communication with an external device, a memory configured to store setting information, a battery cell configured to supply power to the electronic device, a cable, a power management module, a camera module including an auto focus (AF) carrier and an optical image stabilization (OIS) carrier, a camera module driver, and a processor electrically connected to the communication circuit, the memory, the battery cell, the cable, the power management module, the camera module, and the camera module driver. The processor, in operation, controls the AF carrier and the OIS carrier in a direction opposite to a magnetic field, and controls an output voltage of the camera module driver through the power management module.

In accordance with another aspect of the present disclosure, a method for controlling a noise of an electronic device is provided. The method includes executing an application, measuring a current of a battery cell through a power management module, determining whether the measured current of the battery cell exceeds a threshold value of creating a noise, and reducing the current of the battery cell by controlling the power management module when the measured current of the battery cell exceeds the threshold value.

In accordance with another aspect of the present disclosure, the electronic device having the battery and the camera module may have a vertical stack structure of first and second power lines of the FPCB connected to the battery cell, thus minimizing a noise (e.g., vibration rattle) produced from the camera module by a current generated upon charging and discharging the battery cell. Namely, the electronic device may block electrical effects caused by coil-contained components equipped therein.

In accordance with another aspect of the present disclosure, when a certain application is executed, the electronic device may receive a noise of an inactive coil through the microphone, analyze a vibration frequency of the received noise, and control the creation of noise by an inactive coil to be minimized, based on setting information corresponding to a range of the analyzed vibration frequency.

In accordance with another aspect of the present disclosure, the electronic device may detect the orientation thereof through the acceleration sensor during a telephone call (e.g., time division multiple access (TDMA)) and control the creation of noise by an inactive coil to be minimized, based on setting information corresponding to the detected orientation.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 6 is a side view illustrating a vertical arrangement structure of a flexible printed circuit board (FPCB) according to various embodiments of the present disclosure;

FIG. 12 is a diagram illustrating a voltage control depending on orientations of an electronic device according to various embodiments of the present disclosure;

Throughout the drawings, it should be noted that like reference numbers are used to depict the same or similar elements, features, and structures.

DETAILED DESCRIPTION

Figure 1:
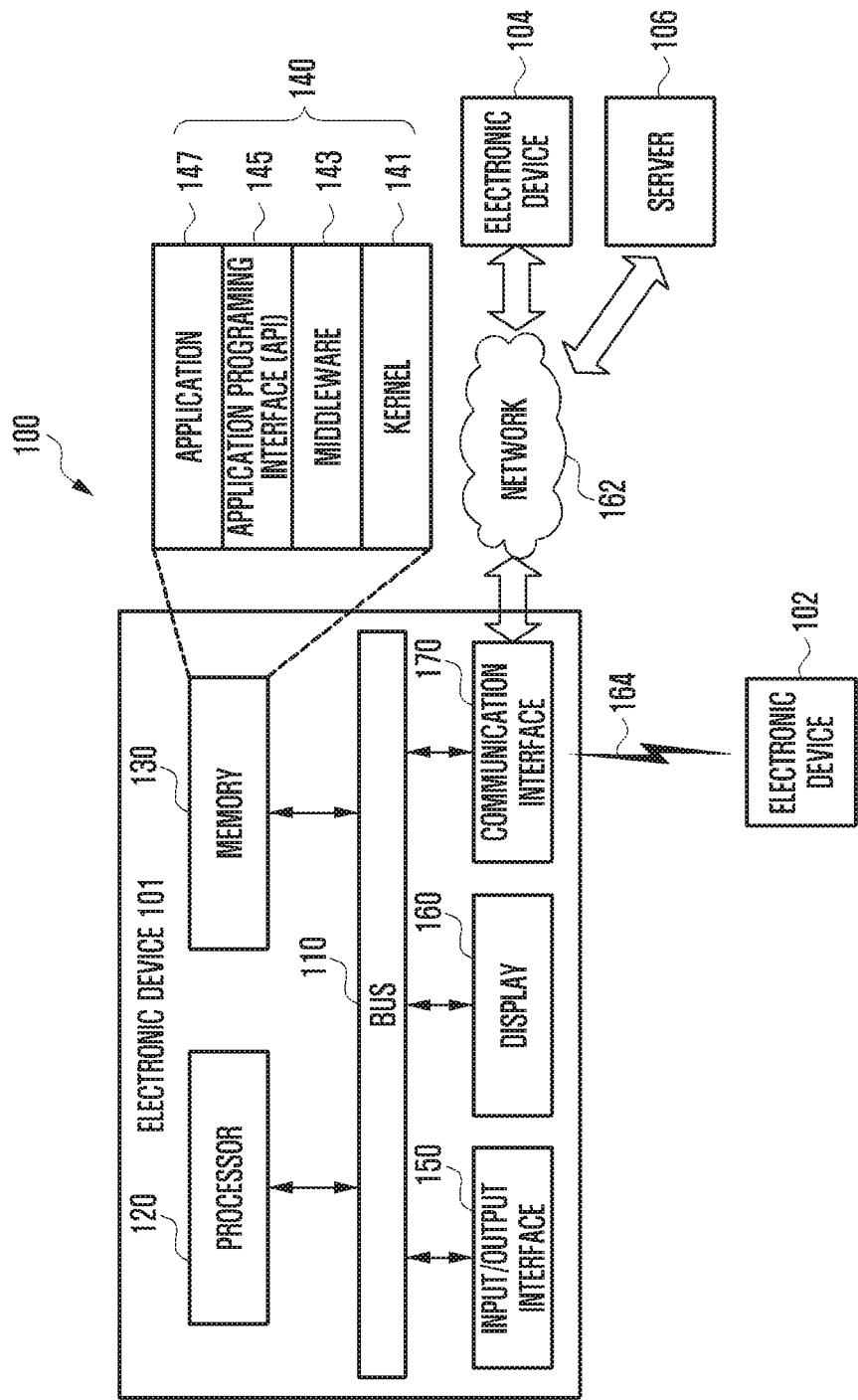
FIG. 1 is a block diagram illustrating a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the present disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a central processing unit (CPU) or an application processor (AP)) capable of performing a corresponding operation by executing one or more software programs stored in a memory device.

The terms used in describing various embodiments of the present disclosure are for the purpose of describing particular embodiments and are not intended to limit the present disclosure. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure.

Electronic devices according to embodiments of the present disclosure may include at least one of, for example, smart phones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) audio layer 3 (MP3) players, mobile medical devices, cameras, or wearable devices. According to an embodiment of the present disclosure, the wearable devices may include at least one of accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), or implantable wearable devices (e.g., implantable circuits).

The electronic devices may be smart home appliances. The smart home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, or electronic picture frames.

The electronic devices may include at least one of various medical devices (e.g., various portable medical measurement devices (such as blood glucose meters, heart rate monitors, blood pressure monitors, or thermometers, and the like), a magnetic resonance angiography (MRA) device, a magnetic resonance imaging (MRI) device, a computed tomography (CT) device, scanners, or ultrasonic devices, and the like), navigation devices, global positioning system (GPS) receivers, event data recorders (EDRs), flight data recorders (FDRs), vehicle infotainment devices, electronic equipment for vessels (e.g., navigation systems, gyrocompasses, and the like), avionics, security devices, head units for vehicles, industrial or home robots, automatic teller machines (ATMs), points of sales (POSs) devices, or internet of things (IoT) devices (e.g., light bulbs, various sensors, electric or gas meters, sprinkler devices, fire alarms, thermostats, street lamps, toasters, exercise equipment, hot water tanks, heaters, boilers, and the like).

The electronic devices may further include at least one of parts of furniture or buildings/structures, electronic boards, electronic signature receiving devices, projectors, or various measuring instruments (such as water meters, electricity meters, gas meters, or wave meters, and the like). The electronic devices may be one or more combinations of the above-mentioned devices. The electronic devices may be flexible electronic devices. Also, the electronic devices are not limited to the above-mentioned devices, and may include new electronic devices according to the development of new technologies.

Hereinafter, electronic devices according to various embodiments of the present disclosure will be described with reference to the accompanying drawings. The term "user" as used herein may refer to a person who uses an electronic device or may refer to a device (e.g., an artificial intelligence electronic device) which uses an electronic device.

FIG. 1 illustrates a network environment including an electronic device according to an embodiment of the present disclosure.

Referring to FIG. 1, a network environment 100 includes an electronic device 101 having a bus 110, a processor 120, a memory 130, an input/output interface 150, a display 160, and a communication interface 170. At least one of the above described components may be omitted from the electronic device 101 or another component may be further included in the electronic device 101.

The bus 110 may be a circuit connecting the above described components 120, 130, and 150-170 and transmitting communications (e.g., control messages and/or data) between the above described components.

The processor 120 may include one or more of a CPU, an AP, and a communication processor (CP). The processor 120 is capable of controlling at least one of other components of the electronic device 101 and/or processing data or operations related to communication.

The memory 130 may include volatile memory and/or non-volatile memory. The memory 130 is capable of storing data or commands related to at least one of other components of the electronic device 101. The memory 130 is capable of storing software and/or a program module 140. For example, the program module 140 may include a kernel 141, middleware 143, an application programming interface (API) 145, application programs (or applications) 147, etc. The kernel 141, the middleware 143 or at least part of the API 145 may be called an operating system (OS).

The kernel 141 is capable of controlling or managing system resources (e.g., the bus 110, the processor 120, the memory 130, etc.) used to execute operations or functions of other programs (e.g., the middleware 143, the API 145, and the application programs 147). The kernel 141 provides an interface capable of allowing the middleware 143, the API 145, and the application programs 147 to access and control/manage the individual components of the electronic device 101.

The middleware 143 may be an interface between the API 145 or the application programs 147 and the kernel 141 so that the API 145 or the application programs 147 can communicate with the kernel 141 and exchange data therewith. The middleware 143 is capable of processing one or more task requests received from the application programs 147 according to the priority. For example, the middleware 143 is capable of assigning a priority for use of system resources of the electronic device 101 (e.g., the bus 110, the processor 120, the memory 130, etc.) to at least one of the application programs 147. For example, the middleware 143 processes one or more task requests according to a priority assigned to at least one application program, thereby performing scheduling or load balancing for the task requests.

The API 145 may be an interface that is configured to allow the application programs 147 to control functions provided by the kernel 141 or the middleware 143. The API 145 may include at least one interface or function (e.g., instructions) for file control, window control, image process, text control, or the like.

The input/output interface 150 is capable of transferring instructions or data, received from the user or external devices, to one or more components of the electronic device 101. The input/output interface 150 is capable of outputting instructions or data, received from one or more components of the electronic device 101, to the user or external devices.

The display 160 may include a liquid crystal display (LCD), a flexible display, a transparent display, a light emitting diode (LED) display, an organic LED (OLED) display, micro-electro-mechanical systems (MEMS) display, an electronic paper display, etc. The display 160 is capable of displaying various types of content (e.g., texts, images, videos, icons, symbols, etc.). The display 160 may also be implemented with a touch screen. In this case, the display 160 is capable of receiving touches, gestures, proximity inputs or hovering inputs, via a stylus pen, or a user's body.

The communication interface 170 is capable of establishing communication between the electronic device 101 and an external device. For example, the communication interface 170 is capable of communicating with an external device connected to a network 162 via wired or wireless communication.

Wireless communication may employ, as cellular communication protocol, at least one of long-term evolution (LTE), LTE Advance (LTE-A), code division multiple access (CDMA), wideband CDMA (WCDMA), universal mobile telecommunications system (UMTS), wireless broadband (WiBro), and global system for mobile communication (GSM). Wireless communication may also include short-wireless communication 164. Short-wireless communication 164 may include at least one of wireless fidelity (Wi-Fi), Bluetooth (BT), near field communication (NFC), magnetic secure transmission (MST), and global navigation satellite system (GNSS). The GNSS may include at least one of GPS, global navigation satellite system (Glonass), Beidou NSS (Beidou), Galileo, the European global satellite-based navigation system, according to GNSS using areas, bandwidths, etc. In the present disclosure, "GPS" and "GNSS" may be used interchangeably. Wired communication may include at least one of universal serial bus (USB), high definition multimedia interface (HDMI), recommended standard 232 (RS-232), and plain old telephone service (POTS). The network 162 may include at least one of the following a telecommunications network, e.g., a computer network (e.g., local area network (LAN) or wide area network (WAN)), the Internet, and a telephone network.

A first external electronic device 102 and a second external electronic device 104 are each identical to or different from the electronic device 101, in terms of type. According to an embodiment, a server 106 is capable of including a group of one or more servers. According to various embodiments, part or all of the operations executed on the electronic device 101 may be executed on another electronic device or a plurality of other electronic devices (e.g., electronic devices 102 and 104 or a server 106). According to an embodiment, when the electronic device needs to perform a function or service automatically or according to a request, it does not perform the function or service, but is capable of additionally requesting at least part of the function related to the function or service from another electronic device (e.g., electronic devices 102 and 104 or a server 106). The other electronic device (e.g., electronic devices 102 and 104 or a server 106) is capable of executing the requested function or additional functions, and transmitting the result to the electronic device 101. The electronic device 101 processes the received result, or further proceeds with additional processes, to provide the requested function or service. To this end, the electronic device 101 may employ cloud computing, distributed computing, or client-server computing technology.

Figure 2:
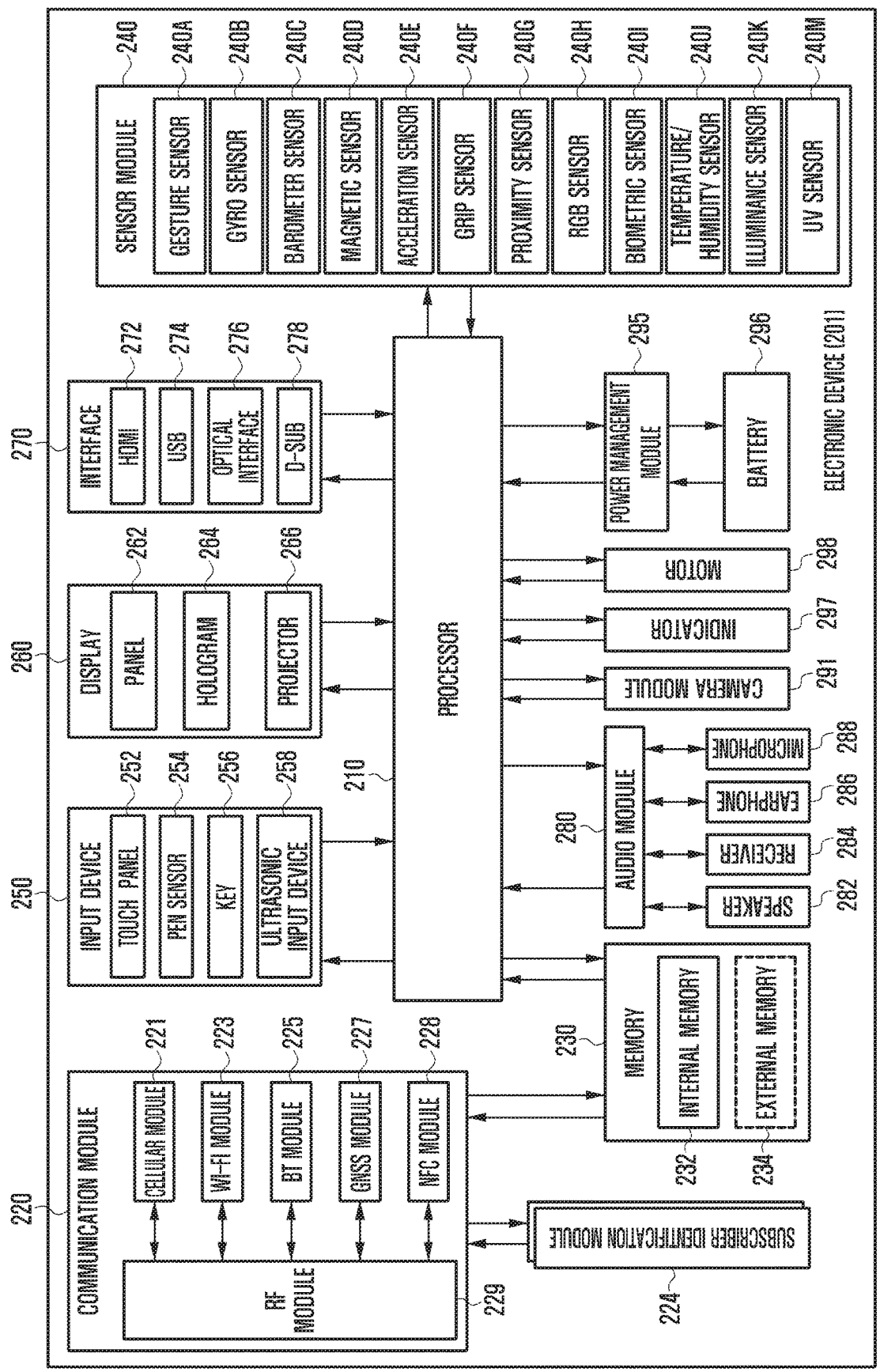
FIG. 2 is a block diagram illustrating an electronic device according to various embodiments of the present disclosure.

FIG. 2 is a block diagram showing a configuration of an electronic device according to an embodiment of the present disclosure.

Referring to FIG. 2, an electronic device 201 may include a part or all of the components in the electronic device 101 shown in FIG. 1. The electronic device 201 may include one or more processors 210 (e.g., APs), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 is capable of driving, for example, an OS or an application program to control a plurality of hardware or software components connected to the processor 210, processing various data, and performing operations. The processor 210 may be implemented as, for example, a system on chip (SoC). The processor 210 may further include a graphic processing unit (GPU) and/or an image signal processor (ISP). The processor 210 may also include at least part of the components shown in FIG. 2, e.g., a cellular module 221. The processor 210 is capable of loading commands or data received from at least one of other components (e.g., a non-volatile memory) on a volatile memory, processing the loaded commands or data. The processor 210 is capable of storing various data in a non-volatile memory.

The communication module 220 may include the same or similar configurations as the communication interface 170 shown in FIG. 1. For example, the communication interface 170 is capable of including the cellular module 221, a Wi-Fi module 223, a BT module 225, a GNSS module 227 (e.g., a GPS module, Glonass module, Beidou module or Galileo module), an NFC module 228, and a radio frequency (RF) module 229.

The cellular module 221 is capable of providing a voice call, a video call, a short message service (SMS) service, an Internet service, etc., through a communication network, for example. The cellular module 221 is capable of identifying and authenticating an electronic device 201 in a communication network by using the SIM 224. The cellular module 221 is capable of performing at least a part of the functions provided by the processor 210. The cellular module 221 may include a CP.

Each of the Wi-Fi module 223, the BT module 225, the GNSS module 227, and the NFC module 228 may include a processor for processing data transmitted or received through the corresponding module. At least part of the cellular module 221, Wi-Fi module 223, BT module 225, GNSS module 227, and NFC module 228 (e.g., two or more modules) may be included in one integrated chip (IC) or one IC package.

The RF module 229 is capable of transmission/reception of communication signals, e.g., RF signals. The RF module 229 is capable of including a transceiver, a power amplifier module (PAM), a frequency filter, a low noise amplifier (LNA), an antenna, etc. At least one of the cellular module 221, the Wi-Fi module 223, the BT module 225, the GNSS module 227, and the NFC module 228 is capable of transmission/reception of RF signals through a separate RF module.

The memory 230 may include an internal memory 232 or an external memory 234. The internal memory 232 is capable of including at least one of a volatile memory, e.g., a dynamic random access memory (DRAM), a static RAM (SRAM), a synchronous dynamic RAM (SDRAM), etc. and a non-volatile memory, e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, an NOR flash memory, etc.), a hard drive, a solid state drive (SSD), etc.

The external memory 234 may include a flash drive, e.g., a compact flash (CF), a secure digital (SD), a micro SD (Micro-SD), a mini SD (Mini-SD), an extreme digital (xD), a multi-media card (MMC), a memory stick, etc. The external memory 234 may be connected to the electronic device 201, functionally and/or physically, through various interfaces.

The sensor module 240 is capable of measuring/detecting a physical quantity or an operation state of the electronic device 201, and converting the measured or detected information into an electronic signal. The sensor module 240 may include at least one of a gesture sensor 240A, a gyro sensor 240B, a barometer sensor 240C, a magnetic sensor 240D, an acceleration sensor 240E, a grip sensor 240F, a proximity sensor 240G, a color sensor 240H (e.g., a red, green and blue (RGB) sensor), a biometric sensor 240I, a temperature/humidity sensor 240J, an illuminance sensor 240K, and a ultraviolet (UV) sensor 240M. Additionally or alternatively, the sensor module 240 may also include an e-nose sensor, an electromyography (EMG) sensor, an electroencephalogram (EEG) sensor, an electrocardiogram (ECG) sensor, an infrared (IR) sensor, an iris sensor and/or a fingerprint sensor. The sensor module 240 may further include a control circuit for controlling one or more sensors included therein. The electronic device 201 may include a processor, configured as part of the processor 210 or a separate component, for controlling the sensor module 240. In this case, while the processor 210 is operating in sleep mode, the processor is capable of controlling the sensor module 240.

The input device 250 may include a touch panel 252, a (digital) pen sensor 254, a key 256, or an ultrasonic input unit 258. The touch panel 252 may be implemented with at least one of a capacitive touch system, a resistive touch system, an IR touch system, and an ultrasonic touch system. The touch panel 252 may further include a control circuit, and the touch panel 252 may include a tactile layer to provide a tactile response to the user. The (digital) pen sensor 254 may be implemented with a part of the touch panel or with a separate recognition sheet. The key 256 may include a physical button, an optical key, or a keypad. The ultrasonic input unit 258 is capable of detecting ultrasonic waves, created in an input tool, through a microphone 288, and identifying data corresponding to the detected ultrasonic waves.

The display 260 may include a panel 262, a hologram unit 264, or a projector 266. The panel 262 may include the same or similar components as the display 160 shown in FIG. 1. The panel 262 may be implemented to be flexible, transparent, or wearable. The panel 262 may also be incorporated into one module together with the touch panel 252. The hologram unit 264 is capable of showing a stereoscopic image in the air by using light interference. The projector 266 is capable of displaying an image by projecting light onto a screen. The screen may be located inside or outside of the electronic device 201. The display 260 may further include a control circuit for controlling the panel 262, the hologram unit 264, or the projector 266.

The interface 270 may include an HDMI 272, a USB 274, an optical interface 276, or a d-subminiature (D-sub) 278.

The interface 270 may be included in the communication interface 170 shown in FIG. 1. Additionally or alternatively, the interface 270 may include a mobile high-definition link (MHL) interface, a SD card/MMC interface, or an IR data association (IrDA) standard interface.

The audio module 280 is capable of providing bidirectional conversion between a sound and an electronic signal. At least part of the components in the audio module 280 may be included in the input/output interface 150 shown in FIG. 1. The audio module 280 is capable of processing sound information input or output through a speaker 282, a receiver 284, earphones 286, a microphone 288, etc.

The camera module 291 is a device capable of taking both still and moving images. The camera module 291 may include one or more image sensors (e.g., a front image sensor or a rear image sensor), a lens, an ISP, a flash (e.g., an LED or xenon lamp), etc.

The power management module 295 is capable of managing power of the electronic device 201. The power management module 295 may include a power management integrated circuit (PMIC), a charger IC, or a battery gauge. The PMIC may employ wired charging and/or wireless charging methods. Examples of the wireless charging method are magnetic resonance charging, magnetic induction charging, and electromagnetic charging. To this end, the PMIC may further include an additional circuit for wireless charging, such as a coil loop, a resonance circuit, a rectifier, etc. The battery gauge is capable of measuring the residual capacity, charge in voltage, current, or temperature of the battery 296.

The battery 296 takes the form of either a rechargeable battery or a solar battery.

The indicator 297 is capable of displaying a specific status of the electronic device 201 or a part thereof (e.g., the processor 210), e.g., a boot-up status, a message status, a charging status, etc. The motor 298 is capable of converting an electrical signal into mechanical vibrations, such as, a vibration effect, a haptic effect, etc. The electronic device 201 may also include a processing unit (e.g., GPU) for supporting a mobile TV. The processing unit for supporting a mobile TV is capable of processing media data pursuant to standards, e.g., digital multimedia broadcasting (DMB), digital video broadcasting (DVB), or mediaFlo™, etc.

Figure 3:
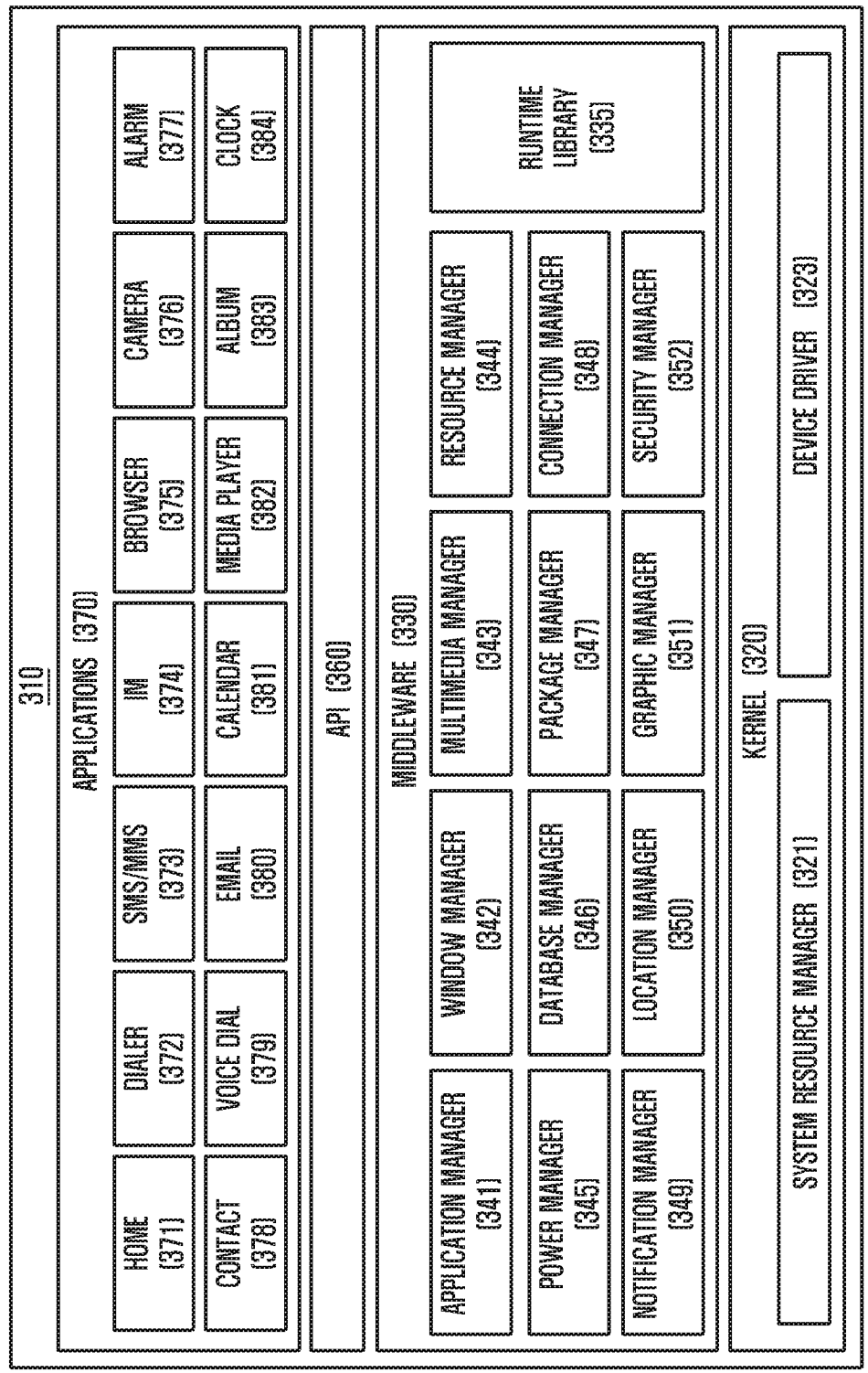
FIG. 3 is a block diagram illustrating a program module according to various embodiments of the present disclosure.

FIG. 3 is a block diagram of a programming module according to an embodiment of the present disclosure.

Referring to FIG. 3, a program module 310 (e.g., program module 140 shown in FIG. 1) is capable of including an OS for controlling resources related to the electronic device (e.g., electronic device 101) and/or various applications (e.g., application programs 147 shown in FIG. 1) running on the OS. The OS may be Android, iOS, Windows, Symbian, Tizen, Bada, etc.

The program module 310 is capable of including a kernel 320, middleware 330, an API 360 and/or applications 370. At least part of the program module 310 may be preloaded on the electronic device or downloaded from a server (e.g., an electronic device 102 or 104, server 106, etc.).

The kernel 320 (for example, kernel 141) may include a system resource manager 321 and/or a device driver 323. The system resource manager 321 may include, for example, a process manager, a memory manager, and a file system manager. The system resource manager 321 may perform a system resource control, allocation, and recall. The device driver 323 may include, for example, a display driver, a camera driver, a Bluetooth driver, a shared memory driver, a USB driver, a keypad driver, a Wi-Fi driver, and an audio driver. Further, according to an embodiment, the device driver 323 may include an inter-process communication (IPC) driver.

The middleware 330 may provide a function required in common by the applications 370. Further, the middleware 330 may provide a function through the API 360 to allow the applications 370 to efficiently use limited system resources within the electronic device. According to an embodiment, the middleware 330 (for example, the middleware 143) may include at least one of a runtime library 335, an application manager 341, a window manager 342, a multimedia manager 343, a resource manager 344, a power manager 345, a database manager 346, a package manager 347, a connection manager 348, a notification manager 349, a location manager 350, a graphic manager 351, and a security manager 352. Furthermore, although not shown, the middleware 330 may also include a payment manager.

The runtime library 335 may include, for example, a library module used by a complier to add a new function through a programming language while the applications 370 are executed. According to an embodiment, the runtime library 335 executes input and output, management of a memory, a function associated with an arithmetic function and the like.

The application manager 341 may manage, for example, a life cycle of at least one of the applications 370. The window manager 342 may manage GUI resources used on the screen. The multimedia manager 343 may detect a format required for reproducing various media files and perform an encoding or a decoding of a media file by using a codec suitable for the corresponding format. The resource manager 344 manages resources such as a source code, a memory, or a storage space of at least one of the applications 370.

The power manager 345 may operate together with a basic input/output system (BIOS) to manage a battery or power and provides power information required for the operation. The database manager 346 may manage generation, search, and change of a database to be used by at least one of the applications 370. The package manager 347 may manage an installation or an update of an application distributed in a form of a package file.

The connection manager 348 may manage, for example, a wireless connection such as Wi-Fi or Bluetooth. The notification manager 349 may display or notify a user of an event such as an arrival message, an appointment, a proximity alarm or the like, in a manner that does not disturb the user. The location manager 350 may manage location information of the electronic device. The graphic manager 351 may manage a graphic effect provided to the user or a user interface (UI) related to the graphic effect. The security manager 352 provides a general security function required for a system security or a user authentication. According to an embodiment, when the electronic device (for example, the electronic device 101) has a call function, the middleware 330 may further include a telephony manager for managing a voice of the electronic device or a video call function.

The middleware 330 is capable of including modules configuring various combinations of functions of the above described components. The middleware 330 is capable of providing modules specialized according to types of operation systems to provide distinct functions. The middleware 330 may be adaptively configured in such a way as to remove part of the existing components or to include new components.

The API 360 (for example, API 145) may be a set of API programming functions, and may be provided with a different configuration according to an OS. For example, in Android or iOS, a single API set may be provided for each platform. In Tizen, two or more API sets may be provided.

The applications 370 (e.g., application programs 147) may include one or more applications for performing various functions, e.g., home 371, dialer 372, SMS/multi-media message service (MMS) 373, instant message (IM) 374, browser 375, camera 376, alarm 377, contact 378, voice dial 379, email 380, calendar 381, media player 382, album 383, and clock 384. Furthermore, although not shown, the applications 370 may also include health care (e.g., an application for measuring amount of exercise, blood sugar level, etc.), and environment information (e.g., an application for providing atmospheric pressure, humidity, temperature, etc.).

According to an embodiment, the applications 370 are capable of including an application for supporting information exchange between an electronic device (e.g., electronic device 101) and an external device (e.g., electronic devices 102 and 104), which is hereafter called 'information exchange application'). The information exchange application is capable of including a notification relay application for relaying specific information to external devices or a device management application for managing external devices.

According to an embodiment, the applications 370 are capable of including an application (e.g., a health care application of a mobile medical device, etc.) having specified attributes of an external device (e.g., electronic devices 102 and 104). According to an embodiment, the applications 370 are capable of including applications received from an external device (e.g., a server 106, electronic devices 102 and 104). According to an embodiment, the applications 370 are capable of including a preloaded application or third party applications that can be downloaded from a server. It should be understood that the components of the program module 310 may be called different names according to types of OSs.

The term "module" according to the embodiments of the disclosure, means, but is not limited to, a unit of one of software, hardware, and firmware or any combination thereof. The term "module" may be used interchangeably with the terms "unit," "logic," "logical block," "component," or "circuit." The term "module" may denote a smallest unit of component or a part thereof. The term "module" may be the smallest unit of performing at least one function or a part thereof. A module may be implemented mechanically or electronically. For example, a module may include at least one of application-specific integrated circuit (ASIC) chip, field-programmable gate arrays (FPGAs), and programmable-logic device known or to be developed for certain operations.

According to various embodiments of the present disclosure, the devices (e.g. modules or their functions) or methods may be implemented by computer program instructions stored in a computer-readable storage medium. In the case that the instructions are executed by at least one processor (e.g. processor 120), the at least one processor may execute the functions corresponding to the instructions. The computer-readable storage medium may be the memory 130. At least a part of the programing module may be implemented (e.g. executed) by the processor 120. At least a part of the programing module may include modules, programs, routines, sets of instructions, and processes for executing the at least one function.

The computer-readable storage medium includes magnetic media such as a floppy disk and a magnetic tape, optical media including a compact disc (CD) ROM and a DVD ROM, a magneto-optical media such as a floptical disk, and the hardware device designed for storing and executing program commands such as ROM, RAM, and flash memory. The program commands include the language code executable by computers using the interpreter as well as the machine language codes created by a compiler. The aforementioned hardware device can be implemented with one or more software modules for executing the operations of the various embodiments of the present disclosure.

The module or programming module of the present disclosure may include at least one of the aforementioned components with omission of some components or addition of other components. The operations of the modules, programming modules, or other components may be executed in series, in parallel, recursively, or heuristically. Also, some operations may be executed in different order, omitted, or extended with other operations.

Figure 4:
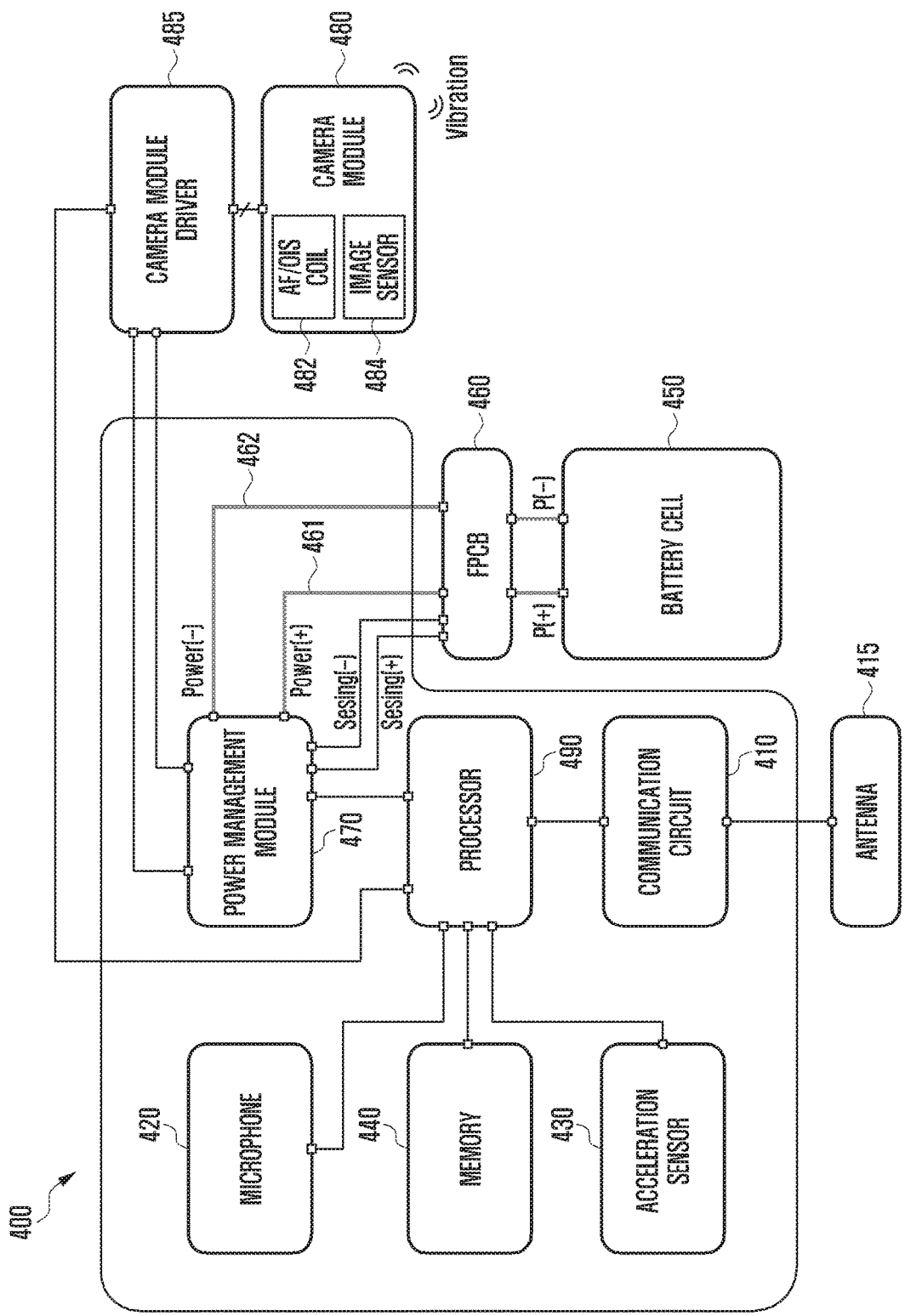
FIG. 4 is a block diagram illustrating a configuration of an electronic device according to various embodiments of the present disclosure.

FIG. 4 is a block diagram illustrating a configuration of an electronic device according to various embodiments of the present disclosure.

Figure 5:
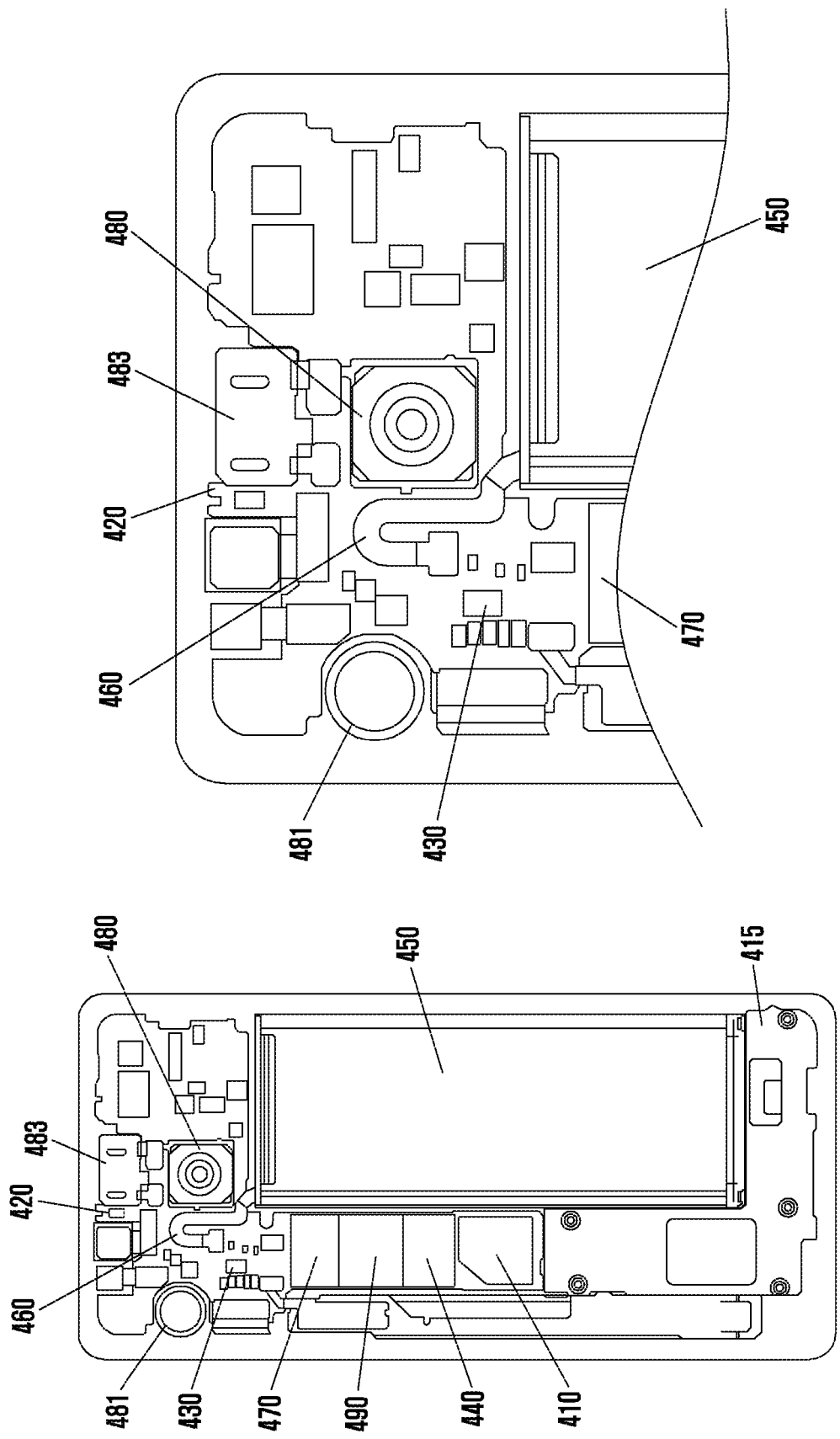
FIG. 5 is a plan view illustrating an internal structure of an electronic device according to various embodiments of the present disclosure.

FIG. 5 is a plan view illustrating an internal structure of an electronic device according to various embodiments of the present disclosure.

Referring to FIGS. 4 and 5, the electronic device 400 according to various embodiments of the present disclosure may include a communication circuit 410, an antenna 415, a microphone 420, an acceleration sensor 430, a memory 440, a battery cell 450, a flexible printed circuit board (FPCB) 460, a power management module 470, a camera module 480, a camera module driver 485, and a processor 490.

According to various embodiments, the communication circuit 410 may perform a communication function of the electronic device 400. The communication circuit 410 may establish a communication channel with a network to support at least one of a voice call, a video call, and data communication with at least one external device. The communication circuit 410 may include various kinds of communication modules such as a mobile communication module (at least one module capable of supporting various communication schemes such as 2G, 3G, 4G, and 5G), a WiFi module, and a short-range communication module. The communication circuit 410 may include a RF transmitter for up-converting the frequency of an outgoing signal and amplifying the up-converted signal, and an RF receiver for low-noise amplifying an incoming signal and down-converting the frequency of the amplified signal. The communication circuit 410 may receive data through a wireless channel and then transmit the data to the processor 490, and may also transmit data outputted from the processor 490 to an external device through a wireless channel.

According to an embodiment, the communication circuit 410 may support the electronic device 400 to perform a telephone call with other electronic device, based on, e.g., time division multiple access (TDMA) communication.

The antenna 415 is electrically connected to the communication circuit 410, and may transmit or receive a signal generated during a call between the electronic device 400 and any other electronic device.

According to various embodiments, the microphone 420 may be used to collect external sounds, i.e., ambient noises.

The microphone 420 may include a plurality of microphones. For example, when the electronic device 400 performs a call with another electronic device, external sounds may be collected through other microphones except a specific microphone used for the call among the plurality of microphones 420.

According to an embodiment, the microphone 420 may receive a noise of an inactive coil when an application of the electronic device 400 is executed. The microphone 420 may record a noise such as vibration rattle created through components (e.g., the camera module 480, a motor 481, and a speaker 483) having a coil in the electronic device 400. After a current control through the power management module 470 and the processor 490, the microphone 420 may check whether a noise such as vibration rattle is created. The vibration rattle may refer to any kind of sound mixed with a noise, in addition to a basic sound produced in the electronic device 400.

The acceleration sensor 430 may sense a state of the electronic device 400 gripped by the user, for example, when the electronic device 400 performs a telephone call with other electronic device using the TDMA communication, and then may transmit a sensing signal to the processor 490. The acceleration sensor 430 may detect the orientation of the electronic device 400 with respect to the up, down, left, and right directions. The acceleration sensor 430 may measure the acceleration, vibration, impact, and motion of the electronic device 400. Although the TDMA communication is exemplarily described in an embodiment, other communication types may be further or alternatively available.

According to various embodiments, the memory 440 may store a program for processing and control of the processor 490, an OS of the electronic device 400, various kinds of applications, and input/output data. The memory 440 may store a UI provided in the electronic device 400 and various kinds of setting information necessary for functions of the electronic device 400.

According to an embodiment, the memory 440 may store setting information about conditions for minimizing the creation of noise in the electronic device 400. The memory 440 may store setting information regarding a current generated during a telephone call and regarding a control variable of a coil corresponding to this current.

The battery cell 450 may supply the charged electric power as the driving power of the electronic device 400.

The FPCB 460 may be a cable having one end connected to the battery cell 450 and the other end connected to the PCB equipped in the electronic device 400. The other end of the FPCB 460 may be formed of a locking type connector such as a board-to-board type connector. The FPCB 460 may have a stack structure in which the first power line (+, 461) and the second power line (−, 462) are arranged vertically. The FPCB 460 may include a battery gauge and a battery gauge ground terminal between the first power line 461 and the second power line 462. The battery gauge may measure at least one of, for example, a battery level, a charging voltage, a charging current, and a temperature of the battery cell.

In the first and second power lines 461 and 462 of the FPCB 460, a high current may be generated during the charging and discharging operations of the battery when an application of the electronic device 400 is executed.

The FPCB 460 according to various embodiments that has a stack structure of the first and second power lines 461 and 462 may cancel a magnetic field generated by a current at the time of charging and discharging the battery. It is therefore possible to remove a noise due to a magnetic field that may be generated from components (e.g., the camera module 480, the motor 481, and the speaker 483) containing a coil.

According to one embodiment, such components containing a coil may be a device in which a vibration element is disposed between the coil and the magnet. For example, the camera module 480 may have a ball disposed between the magnet and the coil. The motor 481 may be composed of a stator having the magnet and a rotor wound with the coil. The speaker 483 may have a diaphragm disposed between the magnet and the coil.

According to various embodiments, the power management module 470 may manage the power of the electronic device 400. The power management module 470 may include a PMIC, a charger integrated circuit, or a battery or fuel gauge. For example, when the electronic device 400 is powered on, the power management module 470 may supply the power charged in the battery cell 450 to other elements (e.g., the processor 490 and the camera module driver 485). The power management module 470 may receive commands from the processor 490 and manage the power supply in response to the received commands. For example, the power management module 470 may supply the power to a display (not shown) and the camera module 480 in response to commands received from the processor 490. The power management module 470 may comply with a wired and/or wireless charging scheme. For example, the wireless charging scheme may be a magnetic resonance scheme, a magnetic induction scheme, or an electromagnetic wave scheme. In case of the wireless charging scheme, an additional circuit such as a coil loop, a resonant circuit, a rectifier, or the like may be further included.

According to one embodiment, the power management module 470 may control the charging and discharging of the battery cell 450. The power management module 470 may measure a consumed current of the battery cell 450 and control the current of the battery cell 450 in response to commands received from the processor 490. The power management module 470 may control the voltage (e.g., 1.8V to 3.3V) for a power port of the camera module driver 485. The power management module 470 may perform, for example, I2C command communication with the processor 490.

According to various embodiments, the camera module 480 may capture a still image and record a video. The camera module 480 may include one or more image sensors (e.g., a front sensor and/or a rear sensor), a lens, an ISP, and/or a flash (e.g., LED or xenon lamp).

According to one embodiment, the camera module 480 may be subject to the influence of a noise (e.g., a magnetic field) generated by a high current of the FPCB 460, thus causing vibration rattle. The camera module 480 may perform an auto focus (AF) function and an optical image stabilization (OIS) function. The camera module 480 may include an AF and OIS coil 482 and an image sensor 484. The AF and OIS coil 482 may generate a magnetic flux that allows the camera module 480 to perform the AF and OIS functions. The AF and OIS coil 482 may be composed of a plurality of coils. The image sensor 484 may convert an optical image obtained through the camera module 480 into an electrical signal. The camera module 480 may further include a lens, at least one magnet, an OIS ball, an OIS carrier, an AF ball, an AF carrier, a shield can, and the like.

The camera module driver 485 may control the AF and OIS coil 482 to cancel the vibration rattle caused by a noise (e.g., a magnetic field) of the camera module 480. The camera module driver 485 may receive a control operating voltage of, for example, 1.8V to 3.3V from the power management module 470. The camera module driver 485 may generate magnetism in the AF and OIS coil 482 according to the control operating voltage of 1.8V to 3.3V and control (e.g., fix) the movement of the AF ball and the OIS ball.

According to various embodiments, the processor 490 may control the overall operation of the electronic device 400 and a signal flow between elements of the electronic device 400 and may also perform a function of processing data. The processor 490 may be composed of, for example, a CPU, an AP, and a CP. The processor 490 may be formed of a single core processor or a multi-core processor, and may be composed of a plurality of processors.

According to one embodiment, the processor 490 may control the functions and operations of the communication circuit 410, the antenna 415, the microphone 420, the acceleration sensor 430, the memory 440, the battery cell 450, the FPCB 460, the power management module 470, the camera module 480, and the camera module driver 485. The processor 490 may perform a function of minimizing vibration rattle produced from the camera module 480 because of a noise (e.g., a magnetic field) created by a current generated upon charging and discharging the battery cell 450. The processor 490 may perform a function of blocking electrical effects caused by components (e.g., the camera module 480, the motor 481, and the speaker 483) having the coil in the electronic device 400. The processor 490 may analyze a vibration frequency of a noise received via the microphone 420 and, based on setting information of the memory 440 corresponding to a range of the analyzed vibration frequency, may perform a function of minimizing the creation of noise by an inactive coil (e.g., the AF and OIS coil 482). The processor 490 may analyze the orientation of the electronic device 400 received via the acceleration sensor 430 during a telephone call (e.g., TDMA) and, based on setting information of the memory 440 corresponding to this analysis result, may perform a function of minimizing the creation of a vibration noise by the inactive coil (e.g., the AF and OIS coil 482).

Referring to FIG. 5, the FPCB 460 and the camera module 480 may be disposed adjacent to each other within a certain distance (e.g., 0.01 mm to 4 mm). The closer the distance between the FPCB 460 and the camera module 480 is, the stronger the influence of a magnetic field noise generated in the FPCB 460 on the AF/OIS coil 482 in the camera module 480 may be. The FPCB 460 may also affect the motor 481 and the speaker 483 both having the coil, depending a distance therefrom. However, by configuring the first and second power lines 461 and 462 of the FPCB 460 in the form of a vertical stack, a noise created from coil-contained components (e.g., the camera module 480, the motor 481, the speaker 483, etc.) by a current generated in charging and discharging of the battery cell 450 may be minimized.

FIG. 6 is a side view illustrating a vertical arrangement structure of an FPCB according to various embodiments of the present disclosure.

Figure 7:
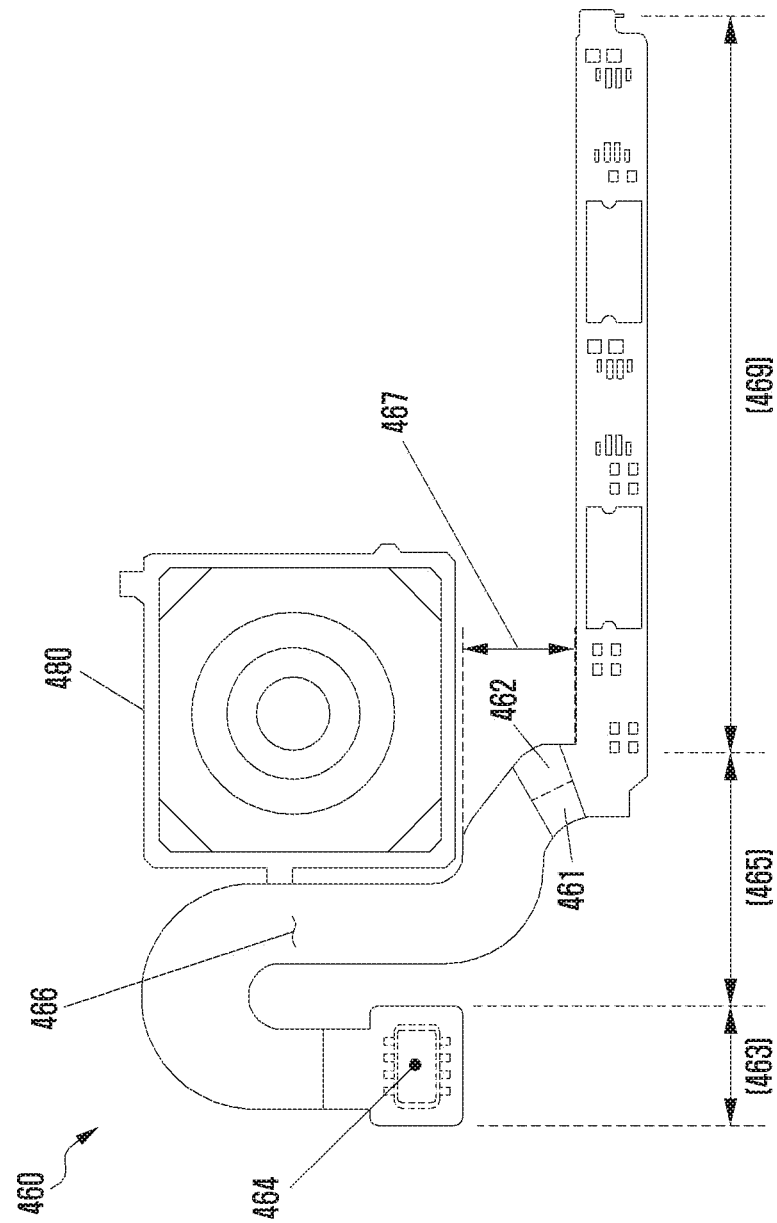
FIG. 7 is a schematic view illustrating a configuration of an FPCB according to various embodiments of the present disclosure.

FIG. 7 is a schematic view illustrating a configuration of an FPCB according to various embodiments of the present disclosure.

Figure 8:
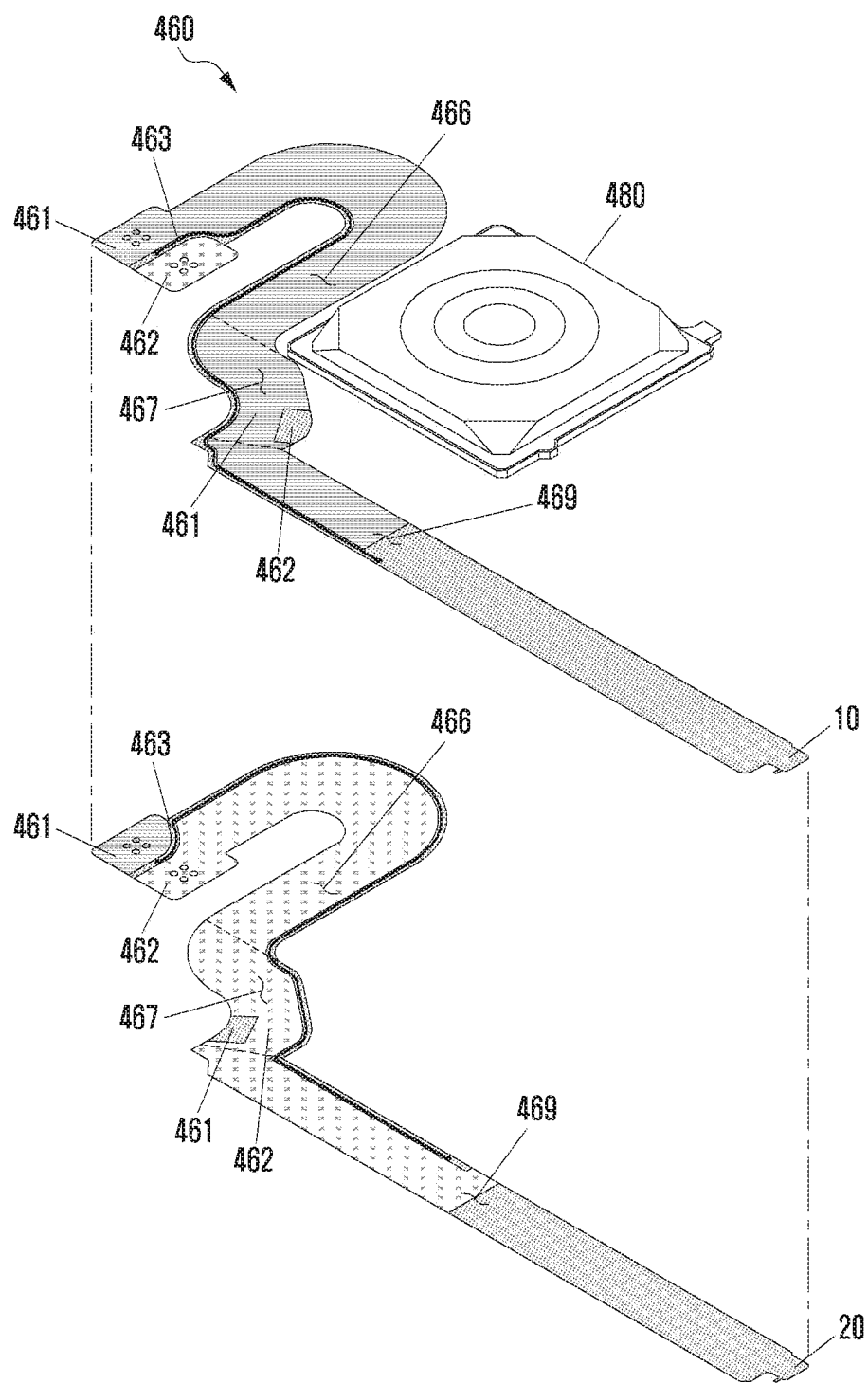
FIG. 8 is an exploded perspective view showing a configuration of an FPCB according to various embodiments of the present disclosure.

FIG. 8 is an exploded perspective view showing a configuration of an FPCB according to various embodiments of the present disclosure.

FIGS. 9A, 9B, 9C, 9D, and 9E are side views illustrating examples of a vertical arrangement structure of an FPCB according to various embodiments of the present disclosure.

Referring to FIGS. 6 to 8, and 9A to 9E, the FPCB 460 according to various embodiments has a structure in which a first layer 10 having the first power line 461 and a second layer 20 having the second power line 462 are stacked vertically. A magnetic field may be generated by the first and second power lines 461 and 462 having different current directions.

For example, assuming that the center of the first power line (+, 461) is the central axis in the X-Z plane, the strength of the magnetic field by the FPCB 460 at (r, 0) may be determined as shown in Equation 1.

$$B = K * \frac{I}{r} - K * \frac{I}{r+d} = K * \frac{I}{\text{straight line } a_1} - K * \frac{I}{\text{straight line } b_1}$$ Equation 1

In Equation 1, B denotes the strength of the magnetic field, $a_1$ denotes a straight distance from the center of the first power line (+, 461) to the camera module 480, and $b_1$ denotes a straight distance from the center of the second power line (−, 462) to the camera module 480. The current (I) may be 2.2 A which is the average current of the TDMA.

When the FPCB 460 has a stack structure as shown in FIG. 6, the strength (B) of the magnetic field may be obtained according to Equation 1.

Namely, when related conditions are as shown in Equation 2 below, the strength of the magnetic field of the FPCB 460 having a stack structure in the X-Z plane as shown in FIG. 8 may be obtained.

$$\left(I_1 = I_2, c_1 = a_1 - \frac{1}{2}d_x\right), c_1 = 3.25 \text{ mm}, dz = 0.2 \text{ mm}$$ Equation 2

For example, the strength of the magnetic field of the FPCB 460 on the X axis may be obtained by Equation 3.

$$B_x = K * \frac{I_1}{c_1} - K * \frac{I_2}{c_1} = 0$$ Equation 3

Further, the strength of the magnetic field of the FPCB 460 on the Z axis may be obtained by Equation 4.

$$B_x B_z = K * \frac{I_1}{\sqrt{c_1^2 + \frac{1}{4}d_z^2}} - K * \frac{I_2}{\sqrt{c_1^2 + \frac{1}{4}d_z^2}} = 0$$ Equation 4

The magnetic field of the FPCB 460 having a vertical arrangement structure has the strength of zero which is obtained by Equations 3 and 4. Therefore, when the FPCB 460 is constructed in the form of stack, a noise due to the magnetic field may be minimized.

Referring to FIGS. 6 to 8 and 9A to 9E, the FPCB 460 according to various embodiments may be a cable, and the first and second layers 10 and 20 may be designed to have a vertical arrangement structure. The first layer 10 may include the first power line 461, and the second layer 20 may include the second power line 462. The first and second power lines 461 and 462 may be extended in the same direction. The first and second layers 10 and 20 may be disposed adjacent to and parallel to each other.

The FPCB 460 according to various embodiments, configured to have a vertical stack structure of the first and second power lines 461 and 462, may cancel a magnetic field caused by a current generated upon charging and discharging the battery and thereby remove a noise caused by the magnetic field generated from the coil-contained components (e.g., the camera module 480, the motor 481, and the speaker 483). Namely, even though any coil-contained component is disposed near the side of the FPCB 460, the stack structure of the FPCB 460 may cancel a noise due to the magnetic field and minimize vibration rattle produced from the camera module 480.

According to various embodiments, the first power line 461 may be disposed on the second power line 462. Alternatively, the second power line 462 may be disposed on the first power line 461. The first power line 461 disposed on the second power line 462 may be inclined in a first direction (e.g., right) or in a second direction (e.g., left) from the vertical axis of the second power line 462. Similarly, the second power line 462 disposed on the first power line 461 may be inclined in the first or second direction from the vertical axis of the first power line 461.

Figure 9A:
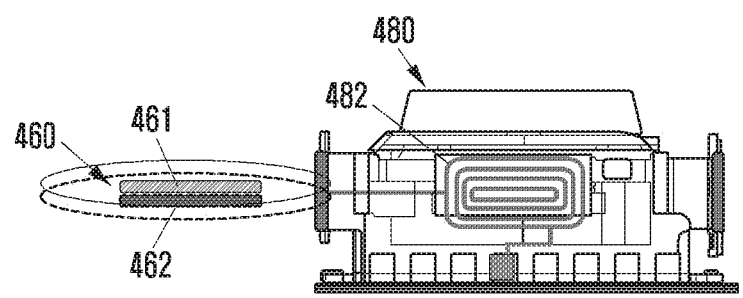
FIGS. 9A, 9B, 9C, 9D, and 9E are side views illustrating examples of a vertical arrangement structure of an FPCB according to various embodiments of the present disclosure.
Figure 9B:
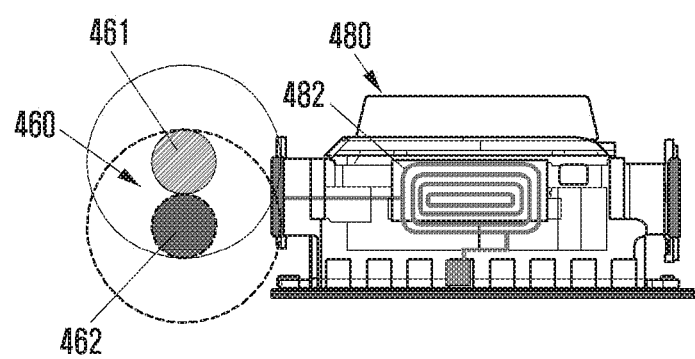
Figure 9C:
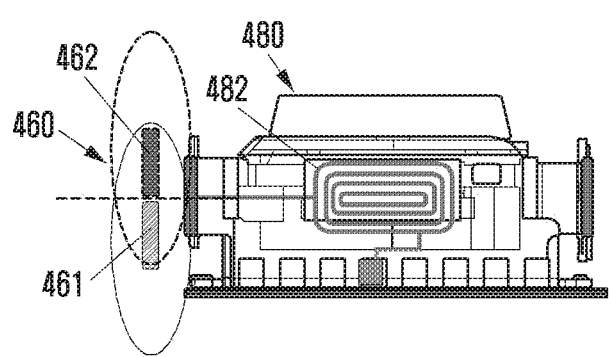
Figure 9D:
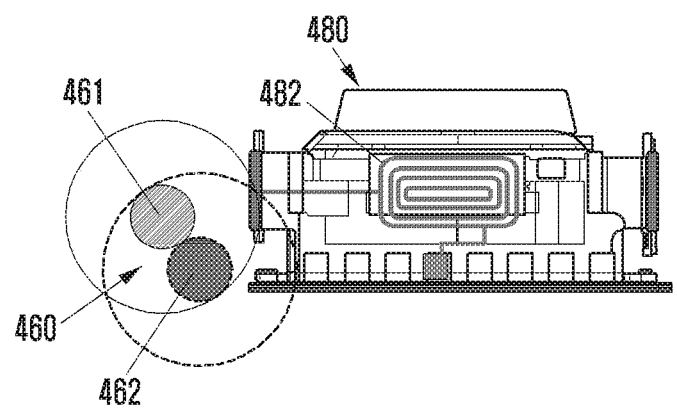
Figure 9E:
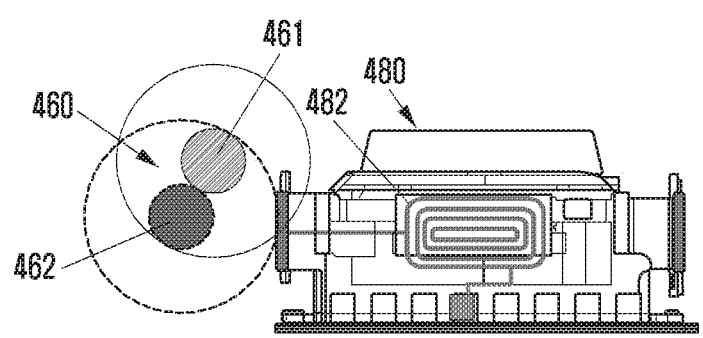

According to various embodiments, as shown FIGS. 9A and 9B, the FPCB 460 in which the first power line 461 is disposed on the second power line 462 may be disposed adjacent to the camera module 480 having the coil (e.g., the AF/OIS coil 482). Also, as shown in FIG. 9C, the FPCB 460 in which the second power line 462 is disposed on the first power line 461 may be disposed adjacent to the camera module 480 having the coil (e.g., the AF/OIS coil 482). Also, as shown in FIG. 9D, the FPCB 460 in which the first power line 461 is disposed on the second power line 462 to be inclined in the second direction (e.g., left) from the vertical axis of the second power line 462 may be disposed adjacent to the camera module 480 having the coil (e.g., the AF/OIS coil 482). Also, as shown in FIG. 9E, the FPCB 460 in which the first power line 461 is disposed on the second power line 462 to be inclined in the first direction (e.g., right) from the vertical axis of the second power line 462 may be disposed adjacent to the camera module 480 having the coil (e.g., the AF/OIS coil 482).

Referring to FIGS. 9A to 9E, the FPCB 460 configured to have a vertical stack structure of the first and second power lines 461 and 462 may cancel a magnetic field caused by a current generated upon charging and discharging the battery and remove a noise caused by the magnetic field even though being disposed near the coil-contained components (e.g., the camera module 480, the motor 481, and the speaker 483).

According to an embodiment, each of the first and second layers 10 and 20 may include a connecting unit 463, a flexible unit 465, and a protection circuit module (PCM) unit 469.

In the FPCB 460, the connecting unit 463 may be connected to the PCB in the electronic device 400, and the PCM unit 469 may be connected to the battery cell 450. The flexible unit 465 may form a power signal pattern.

The connecting unit 463 may have, at a certain position (e.g., rear side), a board-to-board type connector 464 to be connected to the PCB in the electronic device 400.

The flexible unit 465 having a power signal pattern may be formed of a first part 466 and a second part 467. The first part 466 is bent at one end and connected to the connecting unit 463. The second part 467 is connected at one end to the other end of the first part 466. Also, the second part 467 is bent at the other end and connected to the PCM unit 469. Since the second part 467 of the flexible unit 465 is disposed apart from the camera module 480 by a certain distance (e.g., 4 mm), the first and second power lines 461 and 462 may be disposed at left and right parallel positions on one plane. Similarly, since the connecting unit 463 is spaced apart from the camera module 480 by a certain distance (e.g., 4 mm), the first and second power lines 461 and 462 may be disposed at left and right parallel positions on one plane.

The PCM unit 469 may be connected at one end to the other end of the second part 467 of the flexible unit 465 and then extended on the straight. The PCM unit 469 may be connected to the battery cell 450 to control charging and discharging of the battery cell 450.

Referring to FIGS. 7 and 8, since the connecting unit 463 is disposed apart from the camera module 480 by a certain distance (e.g., 4 mm), the connecting unit 463 equipped in each of the first and second layers 10 and 20 may allow the first and second power lines 461 and 462 to be disposed at left and right parallel positions. Similarly, since the second part 467 of the flexible unit 465 is disposed apart from the camera module 480 by a certain distance (e.g., 4 mm), the second part 467 of the flexible unit 465 equipped in each of the first and second layers 10 and 20 may allow the first and second power lines 461 and 462 to be disposed at left and right parallel positions.

According to one embodiment, the flexible unit 465 may need to have sufficient flexibility against a possible bending force when the battery cell 450 is mounted in the electronic device 400. For this, the second part 467 of the flexible unit 465 equipped in each of the first and second layers 10 and 20 may have a removed portion, which may be disposed across when the first and second layers 10 and 20 are stacked. Therefore, the flexibility may be obtained.

Figure 10:
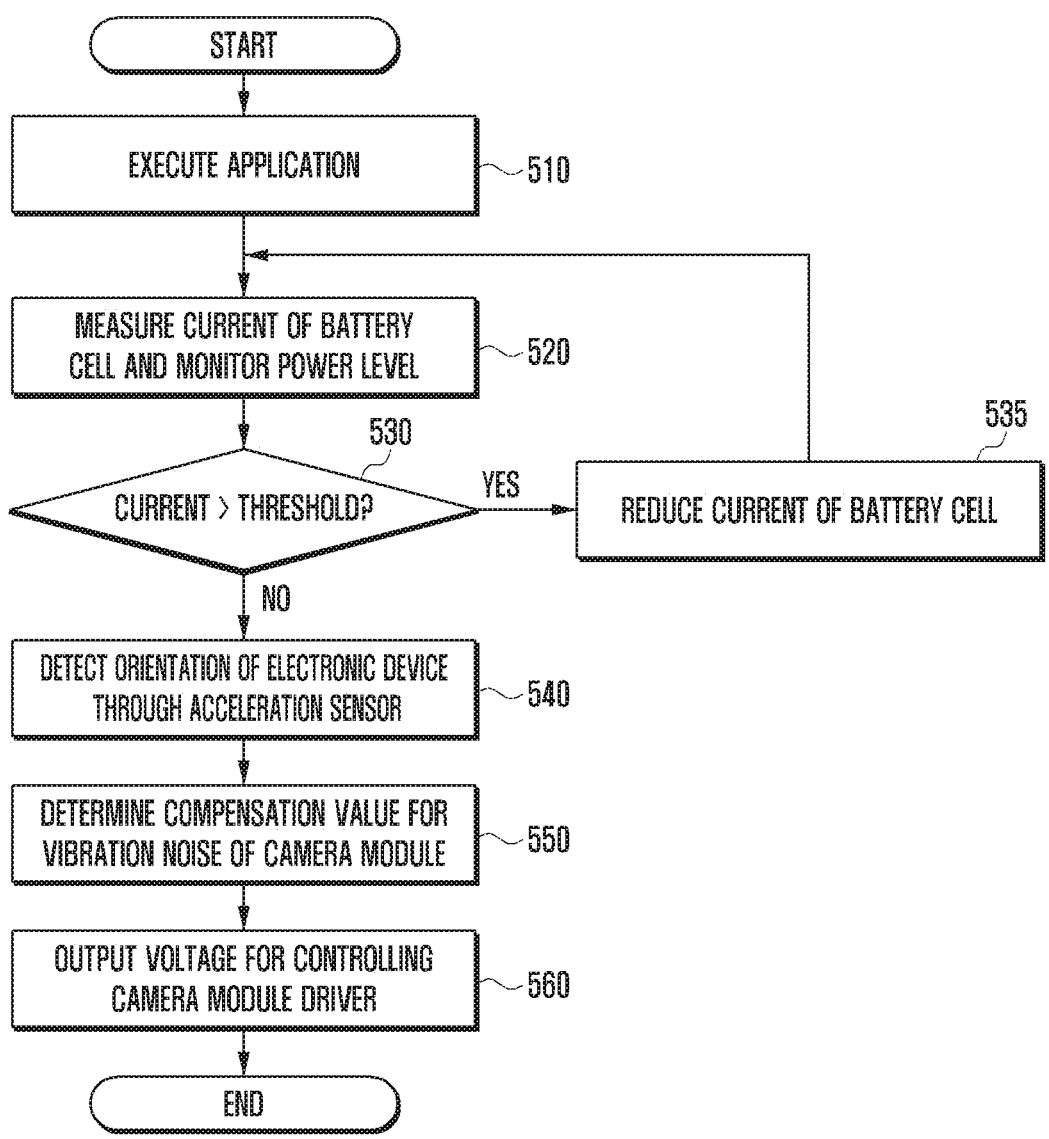
FIG. 10 is a flow diagram illustrating a noise control method of an electronic device according to various embodiments of the present disclosure.

FIG. 10 is a flow diagram illustrating a noise control method of an electronic device according to various embodiments of the present disclosure.

At operation 510, the electronic device 400 may execute a call application with another electronic device via TDMA communication. Although the TDMA communication is exemplarily described in one embodiment, other communication types may be further or alternatively available.

At operation 520, while the call application is running, the electronic device 400 may measure a current of the battery cell 450 through the power management module 470 and monitor a received power level from a base station.

At operation 530, the processor 490 of the electronic device 400 may compare the current of the battery cell 450 measured at operation 520 with a threshold value of a noise creation condition. Namely, the processor 490 may determine whether the measured current of the battery cell 450 exceeds the threshold value.

If it is determined at operation 530 that the measured current of the battery cell 450 exceeds the threshold value, the processor 490 of the electronic device 400 may reduce, at operation 535, the current of the battery cell 450 by adjusting the power level to a limit allowed by the specification.

At operation 540, the electronic device 400 may detect the orientation of the electronic device 400 through the acceleration sensor 430.

At operation 550, the processor 490 of the electronic device 400 may determine a compensation value for a vibration noise of the camera module 480, based on the orientation of the electronic device 400. At this operation, based on setting information stored in the memory, the processor 490 may determine a first vibration compensation value for the AF/OIS coil 482 in the camera module 480 depending on the orientation of the electronic device 400, and a second vibration compensation value for the vibration frequency and amplitude of the camera module 480.

At operation 560, the processor 490 of the electronic device 400 may output a voltage capable of controlling the camera module driver 485 through the power management module 470, based on the compensation value determined at operation 550. Then the camera module driver 485 may receive a control voltage of, for example, 1.8V to 3.3V through the power management module 470, and control the AF and OIS coil 482 to cancel the vibration rattle due to the noise of the camera module 480.

Figure 11:
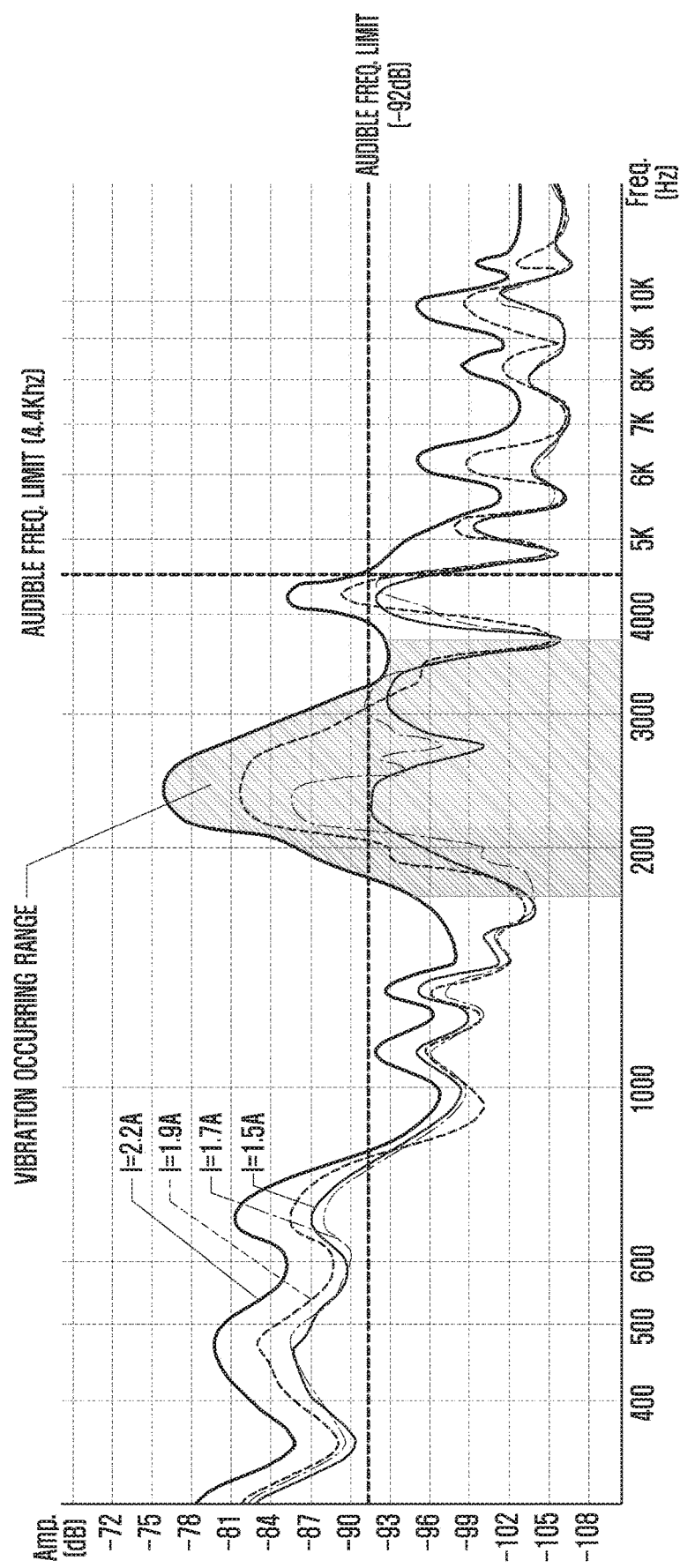
FIG. 11 is a graph illustrating changes in current value and in vibration noise depending on power levels according to various embodiments of the present disclosure.

FIG. 11 is a graph illustrating changes in current value and in vibration noise depending on power levels according to various embodiments of the present disclosure.

Referring to FIG. 11 and Table 1 below, the intensity of the vibration noise increases as the current (I) flowing in the battery cell 450 becomes stronger. It may be therefore predicted that the strength of the magnetic field caused by the FPCB 460 increases in proportion to the increase of the current (I).

TABLE 1

| | Current (Level) | | | |
|---|---|---|---|---|
| | 1.1 A (Level 8) | 1.5 A (Level 7) | 1.9 A (Level 6) | 2.2 A (Level 5) |
| Vibration Intensity | −91 dB | −86 dB | −82 dB | −75 dB |

FIG. 12 is a diagram illustrating a voltage control depending on orientations of an electronic device according to various embodiments of the present disclosure.

At the above-described operation 540, the electronic device 400 may detect the orientation the electronic device 400, being varied by the user, through the acceleration sensor 430. Based on this orientation of the electronic device 400, the power management module 470 may output a voltage for controlling the camera module driver 485. The camera module driver 485 may include an AF driver and an OIS driver.

The operation 540 of detecting the orientation of the electronic device 400 through the acceleration sensor 430 may include detecting the direction of gravity of the AF/OIS coil 482 in the camera module 480 and detecting the orientation of the electronic device 400 with respect to the up, down, left, and right directions. Based on the positions of the FPCB 460 and the camera module 480, the direction of the magnetic field may be preset in advance. The AF/OIS coil 482 may be set fixedly in the opposite direction of the magnetic field in order to minimize the influence of the magnetic field, and the strength thereof may be controlled via a voltage as illustrated in FIG. 11. For example, the AF carrier (e.g., including a ball) and the OIS carrier (e.g., including a ball) both equipped in the camera module 480 may be affected by gravity in spite of the light weight. The direction of gravity and the direction of the magnetic field may be changed depending on the layout design of the camera module 480 and the FPCB 460.

Referring to FIG. 12, when the user places the electronic device 400 such that the camera module 480 is positioned in the upward direction, the direction of the magnetic field is orthogonal to the direction of gravity. In this case, the operating voltage of the camera module driver 485 (e.g., including the OIS driver and the AF driver) is controlled to be 2.6V.

Additionally, when the user places the electronic device 400 such that the camera module 480 is positioned in the downward direction, the direction of the magnetic field is orthogonal to the direction of gravity. In this case, the operating voltage of the camera module driver 485 (e.g., including the OIS driver and the AF driver) is controlled to be 2.6V.

Additionally, when the user places the electronic device 400 such that the camera module 480 is positioned in the leftward direction, the direction of the magnetic field is opposite to the direction of gravity. In this case, the operating voltage of the camera module driver 485 (e.g., including the OIS driver and the AF driver) is controlled to be 3.3V.

Additionally, when the user places the electronic device 400 such that the camera module 480 is positioned in the rightward direction, the direction of the magnetic field is the same as the direction of gravity. In this case, the operating voltage of the camera module driver 485 (e.g., including the OIS driver and the AF driver) is controlled to be 1.8V.

Figure 13:
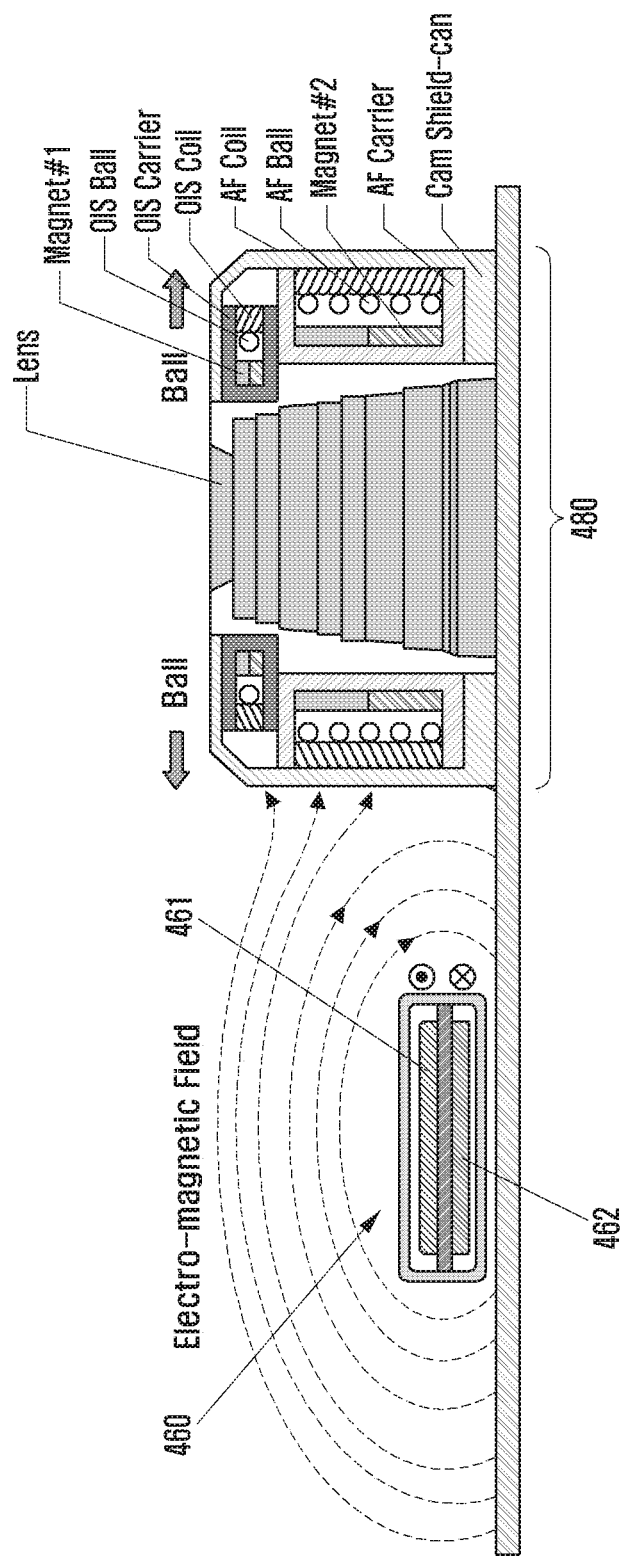
FIG. 13 is a diagram illustrating an operating state in a camera module depending on an operating voltage applied to a camera module driver from a power management module according to various embodiments of the present disclosure.

FIG. 13 is a diagram illustrating an operating state in a camera module depending on an operating voltage applied to a camera module driver from a power management module according to various embodiments of the present disclosure.

Referring to FIG. 13, when a control voltage (e.g., 1.8V to 3.3V) is applied to the camera module driver 485 from the power management module 470, the AF ball and the OIS ball included in the camera module 480 may be changed in position from a floating state to a fixed state by the magnetic field of the AF coil and the OIS coil. For example, when the AF ball and the OIS ball are changed from the floating state to the fixed state, the lens of the camera module 480 may move upward, downward, leftward or rightward by the movement of the balls. The floating state may be a first fixed state in which the movement of the AF ball and the OIS ball is fixed by the magnetic force of magnets (magnet #1 and magnet #2) fixed in the camera module 480. The AF ball and the OIS ball may move toward the AF coil and the OIS coil because of the strong magnetic field generated in the FPCB 460. Namely, the first fixed state may be changed to the second fixed state. The repetition of the first and second fixed states may cause vibration rattle. Further, two or more AF balls and two or more OIS balls may be provided in the AF carrier and the OIS carrier, respectively. In this case, different and complex vibration rattle may occur.

When the balls (e.g., AF balls and OIS balls) included in the camera module 480 are fixed, the influence of the magnetic field by the current of the FPCB 460 may be diminished, and thus the movement of the balls due to the magnetic field may be reduced. Namely, by controlling the voltage (e.g., 1.8V to 3.3V) applied to the camera module driver 485 from the power management module 470, it is possible to control the state of the balls between the floating state and the fixed state.

Figure 14:
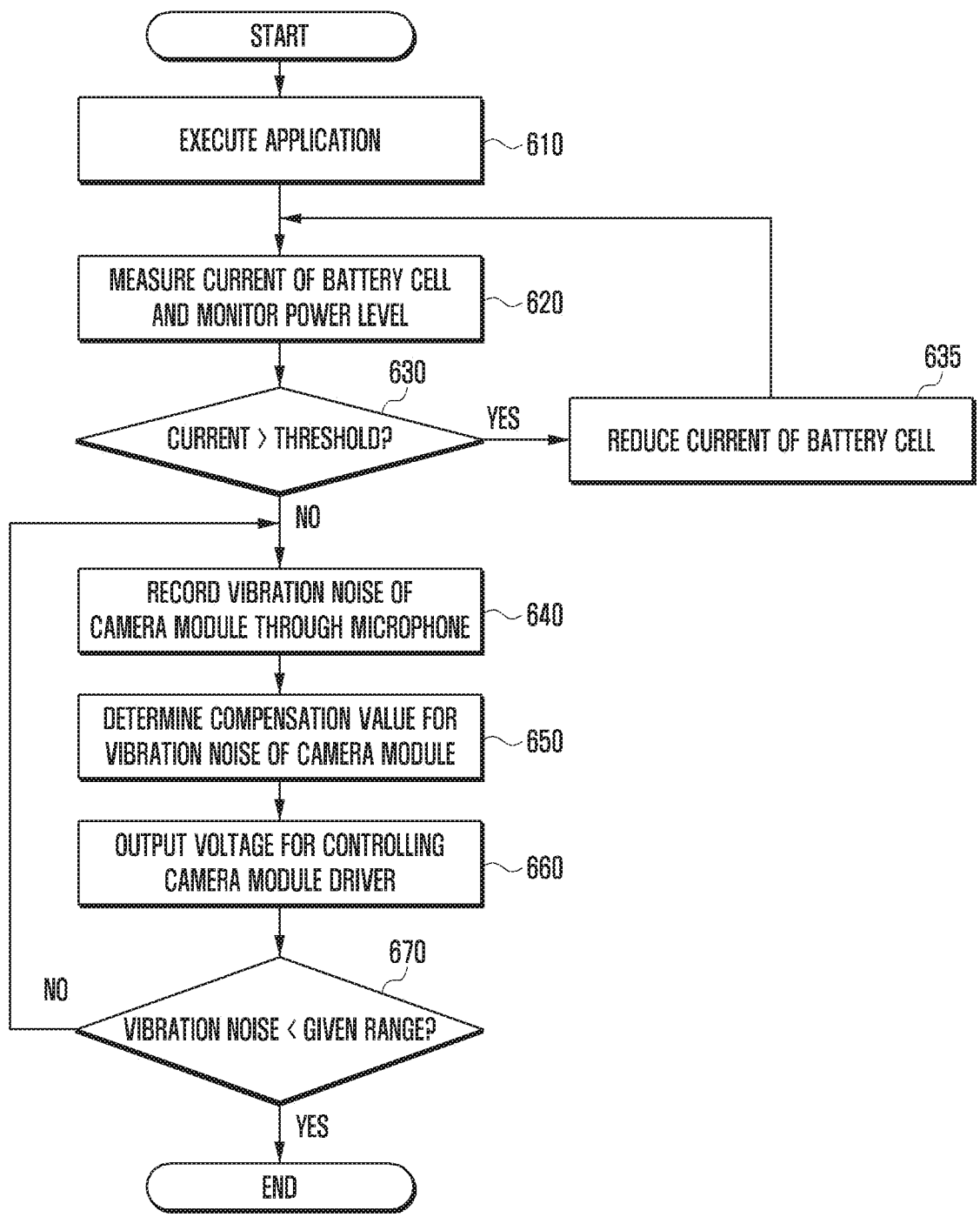
FIG. 14 is a flow diagram illustrating another noise control method of an electronic device according to various embodiments of the present disclosure.

FIG. 14 is a flow diagram illustrating another noise control method of an electronic device according to various embodiments of the present disclosure.

At operation 610, the electronic device 400 may execute a predetermined application. For example, the predetermined application may be a call application required for a telephone call between the electronic device 400 and another electronic device. In this embodiment, TDMA communication will be described as an example of a plurality of applications since in the TDMA communication a repetitive change in magnetic field occurs due to repeated current changes and causes a regular movement of the balls (e.g., AF balls and OIS balls).

At operation 620, while the call application is running, the electronic device 400 may measure a current of the battery cell 450 through the power management module 470 and monitor a received power level from a base station.

At operation 630, the processor 490 of the electronic device 400 may compare the current of the battery cell 450 measured at operation 620 with a threshold value of a noise creation condition. Namely, the processor 490 may determine whether the measured current of the battery cell 450 exceeds the threshold value.

If it is determined at operation 630 that the measured current of the battery cell 450 exceeds the threshold value, the processor 490 of the electronic device 400 may reduce, at operation 635, the current of the battery cell 450 by adjusting the power level to a limit allowed by the specification.

At operation 640, the electronic device 400 may record a vibration noise of the camera module 480 by the current of the FPCB 460 through the microphone 420 adjacent to the camera module 480. The processor 490 of the electronic device 400 may analyze the frequency and amplitude of the vibration noise by Fourier transforming the vibration noise recorded through the microphone 420.

At operation 650, the processor 490 of the electronic device 400 may determine a compensation value for the recorded vibration noise of the camera module 480. At this operation, based on setting information stored in the memory, the processor 490 may determine a first vibration compensation value for the AF/OIS coil 482 in the camera module 480 depending on the orientation of the electronic device 400, and a second vibration compensation value for the vibration frequency and amplitude of the camera module 480.

At operation 660, the processor 490 of the electronic device 400 may output a voltage capable of controlling the camera module driver 485 through the power management module 470, based on the compensation value determined at operation 650.

At operation 670, the processor 490 of the electronic device 400 may determine whether the vibration noise is within a given range through the control voltage of operation 660. If the vibration noise is within the given range, the process is ended. If the vibration noise exceeds the given range, the above-discussed operations 640 to 660 may be performed again.

Figure 15:
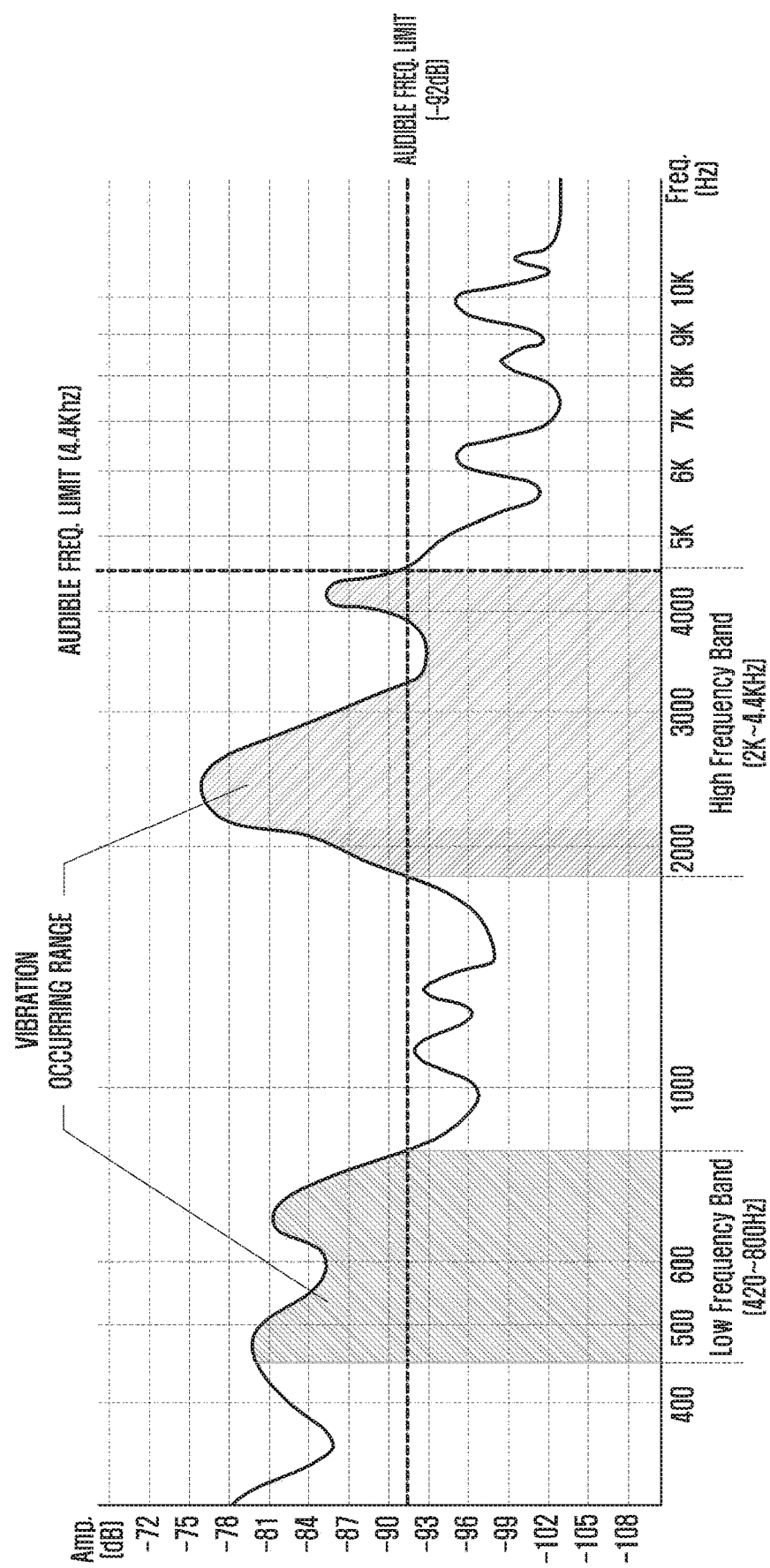
FIG. 15 is a graph illustrating a frequency spectrum for a vibration noise of a camera module according to various embodiments of the present disclosure.

FIG. 15 is a graph illustrating a frequency spectrum for a vibration noise of a camera module according to various embodiments of the present disclosure.

Referring to FIGS. 15 and 13, in the audible frequency band, the spectrum of the vibration noise may be divided into a low frequency band and a high frequency band. For example, in the low frequency band (420 to 800 Hz), the vibration noise may be created due to collision between the shield can and the AF carrier (e.g., including the ball) both included in the camera module 480. In the high frequency band (2 to 4.4 KHz), the vibration noise may be created due to collision between the lens and the OIS carrier (e.g., including the ball) both included in the camera module 480.

Accordingly, the operating voltage of the camera module driver 485 for controlling the camera module 480 may be defined as shown in Table 2 below.

TABLE 2

| Vibration Freq. Band | Vibration Noise Source | Camera Module Driver (OIS) Control Voltage | Camera Module Driver (AF) Control Voltage |
|---|---|---|---|
| Low Freq. Band (420~800 Hz) | Shield Can/AF Carrier | 1.8 V | 3.3 V |
| High Freq. Band (2K~4.4 KHz) | Lens/OIS Carrier | 3.3 V | 1.8 V |
| Low and High Freq. Bands | Shield Can/AF Carrier, Lens/OIS Carrier | 3.3 V | 3.3 V |

As shown in Table 2, since one of the vibration noise sources in the low frequency band is the AF carrier, the power management module 470 may control the voltage of the camera module driver (AF) to 3.3V and also control the voltage of the camera module driver (OIS) to 1.8V. This may reduce the consumption current of the electronic device 400.

Additionally, since one of the vibration noise sources in the high frequency band is the OIS carrier, the power management module 470 may control the voltage of the camera module driver (OIS) to 3.3V and also control the voltage of the camera module driver (AF) to 1.8V so as to reduce the consumption current of the electronic device 400.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a cable including a first layer forming a first power line and a second layer forming a second power line,
wherein the first and second layers are arranged in a vertical stack structure, and
wherein the cable cancels out a magnetic field generated by a current in charging and discharging a battery cell of the electronic device, and removes a noise due to a magnetic field generated from a coil-contained component of the electronic device, and
wherein the first power line is disposed directly on the second power line and the first power line and the second power line is disposed adjacent to a camera.

2. The electronic device of claim 1, wherein the coil-contained component is disposed near a side of the cable to cancel the noise.

3. The electronic device of claim 1, wherein the coil-contained component includes a vibration element between a coil and a magnet.

4. The electronic device of claim 1, wherein the first power line is disposed on the second power line and inclined in a first direction or a second direction from a vertical axis of the second power line.

5. The electronic device of claim 1, wherein the coil-contained component is at least one of the camera, a motor, or a speaker, all of which are disposed in the electronic device.

6. The electronic device of claim 1, wherein the cable is connected at one end thereof to the battery cell and connected at the other end thereof to a printed circuit board equipped in the electronic device.

7. The electronic device of claim 1, wherein the cable includes a connecting unit, a flexible unit, and a protection circuit module (PCM).

8. The electronic device of claim 7, wherein the connecting unit has a board-to-board type connector connected to a printed circuit board equipped in the electronic device.

9. The electronic device of claim 7, wherein the flexible unit has a first part and a second part, the first part being bent at one end and connected to the connecting unit, and the second part being connected at one end to the other end of the first part.

10. The electronic device of claim 1, wherein the cable includes a connecting unit, a flexible unit, and a PCM unit in each of the first and second layers.

11. The electronic device of claim 10, wherein the flexible unit equipped in each of the first and second layers has a removed portion disposed across so as to obtain flexibility when the first and second layers are stacked.

12. An electronic device comprising:
a communication circuit configured to perform communication with an external device:
a memory configured to store setting information;
a battery cell configured to supply power to the electronic device;
a cable;
a power manager;
a camera including an auto focus (AF) carrier and an optical image stabilization (OIS) carrier;
a camera driver; and
a processor electrically connected to the communication circuit, the memory, the battery cell, the cable, the power manager, the camera, and the camera driver,
wherein the processor, in operation, controls the AF carrier and the OIS carrier in a direction opposite to a magnetic field, and controls an output voltage of the camera driver through the power manager, and
wherein a first power line is disposed directly on a second power line and the first power line and the second power line is disposed adjacent to the camera.

13. The electronic device of claim 12, further comprising:
a microphone configured to receive a noise created from a coil-contained component of the electronic device when an application of the electronic device is executed.

14. The electronic device of claim 12, further comprising:
an acceleration sensor configured to detect an orientation of the electronic device when an application of the electronic device is executed.

15. A method for controlling a noise of an electronic device, the method comprising:
at the electronic device, executing an application;
at the electronic device, measuring a current of a battery cell through a power manager;
at the electronic device, determining whether the measured current of the battery cell exceeds a threshold value of creating a noise; and
at the electronic device, reducing the current of the battery cell by controlling the power manager when the measured current of the battery cell exceeds the threshold value,
wherein the power manager adjusts a power of a first power line and a second power line, and
wherein the first power line is disposed directly on the second power line and the first power line and the second power line is disposed adjacent to a camera.

16. The method of claim 15, further comprising:
at the electronic device, detecting an orientation of the electronic device through an acceleration sensor;

at the electronic device, determining a compensation value for a vibration noise of a camera, based on the orientation of the electronic device; and at the electronic device, controlling a camera driver through the power manager, based on the determined compensation value.

17. The method of claim 16, wherein the compensation value is for an auto focus (AF)/optical image stabilization (OIS) coil in the camera.

18. The method of claim 15, further comprising:

at the electronic device, recording a vibration noise of a camera by a current of a cable through a microphone;

at the electronic device, determining a compensation value for the recorded vibration noise of the camera; and at the electronic device, controlling a camera driver through the power manager, based on the determined compensation value.

19. The method of claim 18, wherein the compensation value is for an auto focus (AF)/optical image stabilization (OIS) coil in the camera.

* * * * *